(12) United States Patent
Jensen et al.

(10) Patent No.: US 11,935,860 B2
(45) Date of Patent: Mar. 19, 2024

(54) ELECTRICAL CONNECTOR WITH INSULATED CONDUCTIVE LAYER

(71) Applicant: Intel Corporation, Santa Clara, CA (US)

(72) Inventors: Morten Jensen, Mesa, AZ (US); Michael Ryan, Fountain Hills, AZ (US); Srikant Nekkanty, Chandler, AZ (US); Joe F. Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 868 days.

(21) Appl. No.: 16/828,651

(22) Filed: Mar. 24, 2020

(65) Prior Publication Data

US 2021/0305196 A1    Sep. 30, 2021

(51) Int. Cl.
*H01L 23/00* (2006.01)
*H01R 12/71* (2011.01)
*H01R 13/24* (2006.01)

(52) U.S. Cl.
CPC .............. *H01L 24/32* (2013.01); *H01L 24/67* (2013.01); *H01R 12/714* (2013.01); *H01R 13/2421* (2013.01); *H01R 13/2485* (2013.01); *H01R 13/2492* (2013.01)

(58) Field of Classification Search
CPC ............ H01R 13/2492; H01R 13/2485; H01R 13/2421; H01R 12/714; H01L 24/67; H01L 24/32; H05K 1/144; H05K 1/145; H05K 1/14; H05K 1/11
See application file for complete search history.

(56) References Cited

U.S. PATENT DOCUMENTS

| | | | | |
|---|---|---|---|---|
| 5,297,967 A | * | 3/1994 | Baumberger | H05K 7/1069 439/886 |
| 5,897,326 A | * | 4/1999 | Eldridge | H05K 3/3426 257/E23.024 |
| 6,803,649 B1 | * | 10/2004 | He | H01L 23/50 257/E23.067 |
| 7,185,430 B2 | * | 3/2007 | Ochiai | H01R 43/16 29/874 |
| 8,215,965 B2 | * | 7/2012 | Mizoguchi | H05K 3/326 439/66 |
| 9,577,358 B2 | * | 2/2017 | Beroz | H01R 12/73 |

* cited by examiner

*Primary Examiner* — Briggitte R. Hammond
(74) *Attorney, Agent, or Firm* — Schwabe, Williamson & Wyatt, P.C.

(57) ABSTRACT

An interconnect that has an electrically conductive layer, where a first and second insulator layers are coupled with the conductive layer. A region of the conductive layer includes an opening of a portion of the first insulator layer the second insulator layer that are adjacent to the region. An electrical connector of a first device is electrically coupled to a portion of the region on a first side of the conductive layer and an electrical conductor of a second device is electrically coupled with a portion of the region on the second side. Also, an interconnect coupled with a substrate that includes a cylinder extending from a side of the substrate with a plate coupled at the end of the cylinder with an opening that includes two or more tabs of the plate extending into the opening to receive a connector.

9 Claims, 25 Drawing Sheets

ELECTRICAL CONNECTOR WITH INSULATED CONDUCTIVE LAYER

FIELD

Embodiments of the present disclosure generally relate to the field of package assemblies, and in particular interconnects between packages and substrates.

BACKGROUND

Continued increase in high-speed signaling rates, increase in aggregate bandwidth for data center products as well as reduction in end product size of mobile electronic devices such as smart phones and ultrabooks is a driving force for the development of reduced size system in package components with increased operating speed and number of parallel data paths.

DETAILED DESCRIPTION

Figure 1:
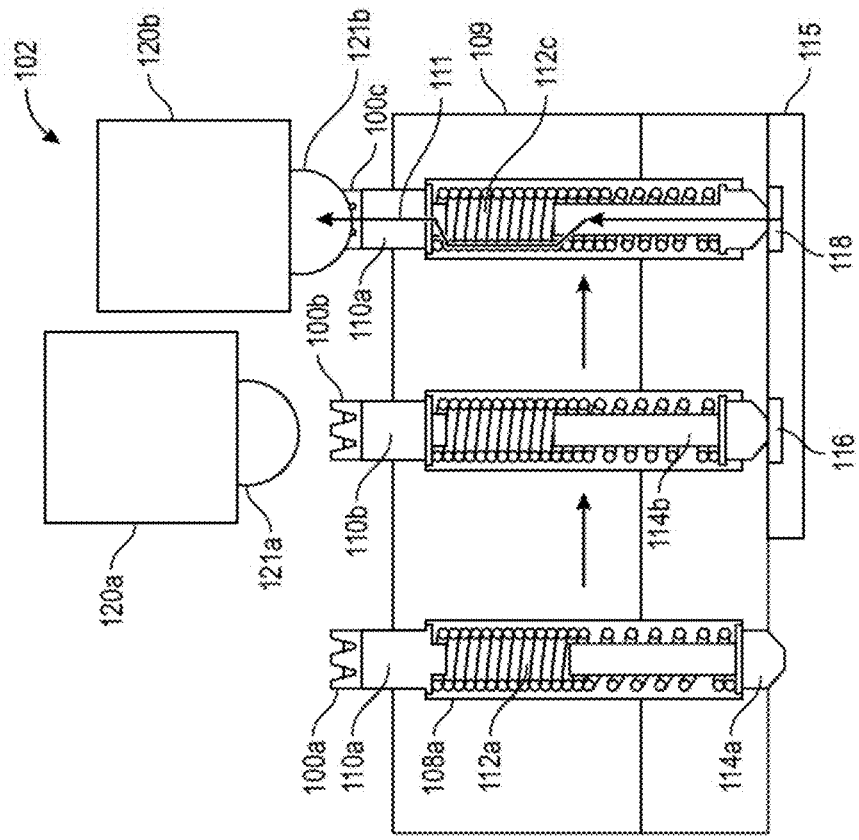
FIG. 1 illustrates a legacy implementation for connecting a package under test to a substrate.
Figure 1:
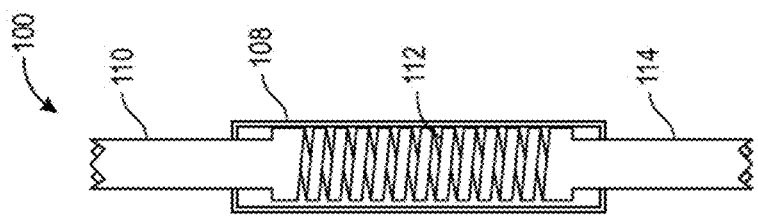

Embodiments of the present disclosure may generally relate to systems, apparatus, and/or processes directed to enabling interconnections within systems, for example between an integrated circuit (IC) package and a substrate, that transmit high-speed signals between components. Embodiments described herein may be directed to enabling these interconnections for transient use such as in testing packages, or for a non-transient use such as attaching a package to a substrate as part of an end-user computing system.

A first set of embodiments described herein may include an interconnect that has an electrically conductive layer, where a first insulated layer is applied to or coupled with a first side of the conductive layer and the second insulator layer is applied to or coupled with a second side of the conductive layer, where a region of the conductive layer includes an opening of a portion of the first insulator layer and an opening of a portion of the second insulator layer that are adjacent to the region, where an electrical connector of a first device is electrically coupled to a portion of the region of the conductive layer on the first side, and an electrical conductor of a second device is to be electrically coupled to a portion of the region on the second side. Other embodiments include where the region of the conductive layer is electrically isolated from other portions of the conductive layer to electrically couple the first device in the second device. Other embodiments include where the region is not electrically isolated from other portions of the conductive layer to cause the region to be a grounded region. Other embodiments may include subregions of the region that are bent upward or bent downward to secure a better connection. Other embodiments may include the conductive layer being a ground layer and further including a power plane layer insulated from, but adjacent to, the conductive layer.

A second set of embodiments described herein may include an interconnect to a substrate that includes a cylinder extending from a side of the substrate, and a plate coupled at the end of the cylinder opposite the substrate, where the plate has an opening proximate to a centerline of the cylinder, with two or more tabs of the plate extending into the opening of the plate, where the opening of the plate is to receive a connector of a device. Other embodiments include where the connector of a device is held into place by the bending of the two or more tabs during insertion of the connector into the cylinder.

The embodiments described herein may be directed to addressing increased data throughput, both the operating speed and the number of parallel data paths for input/output (I/O). In addition, to facilitate design flexibility and upgradeability, electronic systems are increasingly modularly designed. This allows for a mix-and-match of system components to suit the desires of end consumers. Embodiments described herein include high-quality interconnects that connect system components together to provide high performing, non-permanent electro-mechanical connections. Non-permanent interconnects are particularly important in the industrial component test environment where, for example, thousands of stable electrical connections must be made prior to the interconnect needing repair or replacement.

Interconnects will increasingly be required to transmit signals with broadband spectral content in excess of 80 GHz with minimal amplitude loss, and high noise immunity. Legacy interconnects, such as non-permanent test interconnects that are able to withstand thousands of insertions and −10° C. to 120° C. thermal conditions, and meet mechanical requirements, such as normal force, compliance, and robustness may have limited spectral bandwidth that prevents them from transmitting broadband signals. There are legacy non-permanent interconnects that do provide the required broadband electrical performance, but do not withstand the extreme thermal and mechanical cycling required for the high volume manufacturing (HVM) test environment. Furthermore, the cost of current test interconnects scales almost linearly with operating speed and total number of contacts, making it increasingly difficult for legacy electronics manufactures to keep product costs low.

Some embodiments described herein are directed to increasing the electrical performance of non-permanent interconnects, while maintaining the desired thermal and mechanical qualities necessary for the industrial component test environment. Embodiments described herein may also break through the linear cost scaling seen with legacy nonpermanent interconnect technologies. The embodiments described herein may also extend to commercial electronics applications.

Some embodiments described herein may also be directed to interconnect sockets that provide a low insertion force while maintaining high quality electrical conductivity. Legacy socket and pin solutions have limitations meeting low force requirements such as achieving lower stiffness pin with legacy manufacturing techniques and need for a separate loading mechanism required for large pin count packages. In addition, legacy approaches limit fine pitch scaling due to traditional manufacturing such as stamping and forming not meeting size and positional tolerances and accuracy, for example pitches that are less than 100 micrometers. Embodiments described herein provide an interconnect solution which may provide a secure yet separable interface connection (this may also be referred to as "socketable") that is scalable for fine pitch, high density applications. Embodiments described herein may apply to both test and production sockets.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

Various operations may be described as multiple discrete operations in turn, in a manner that is most helpful in understanding the claimed subject matter. However, the order of description should not be construed as to imply that these operations are necessarily order dependent.

Various Figures herein may depict one or more layers of one or more package assemblies. The layers depicted herein are depicted as examples of relative positions of the layers of the different package assemblies. The layers are depicted for the purposes of explanation, and are not drawn to scale. Therefore, comparative sizes of layers should not be assumed from the Figures, and sizes, thicknesses, or dimensions may be assumed for some embodiments only where specifically indicated or discussed.

FIG. 1 illustrates a legacy implementation for connecting a package under test to a substrate. Diagram 100 shows a legacy interconnect in the form of a spring probe, which may also be referred to as a "pogo pin," used to enable non-permanent electrical interconnections during testing between a package and a substrate. The spring probe 100 includes a plunger 110 that extends into a barrel 108, and is coupled with a spring 112 also within the barrel 108. The other end of the spring is coupled with another plunger 114 that extends outside the other end of the barrel 108.

Diagram 102 shows three legacy spring probes 100a, 100b, 100c, that are in different positions of engagement and are all within a housing 109, which also may be referred to as a body or a pin block. Some legacy implementations use a plastic housing 109, which has the disadvantage of the highest electrical losses in the connections, but is mechanically stable and easy to machine. In other legacy implementations, the housing 109 may be a metal housing that provides electrical shielding. In embodiments, the housing 109 is a grounded metal housing that shunts the electromagnetic current flow between adjacent pins, thus reducing coupled noise, or crosstalk. Although the metal housing 109 implementation has lower electrical losses and is more mechanically robust, the cost of producing this legacy interconnect in a metal housing may be as much as five times the plastic version.

As shown in diagram 102, the legacy spring probe 100a, with top plunger 110a, body 108a, spring 112a, and bottom plunger 114a in a ready mode with no solder ball at the top near plunger 110a nor any pad near the bottom plunger 114a. Legacy spring probe 100b shows the lower plunger 114b electrically coupled to a pad 116 of the substrate 115, and the package 120a with the solder ball 121a descending toward the plunger 110b. Legacy spring probe 100c shows the package 120b with solder ball 121b in contact with the top plunger 110a, compressing the spring 112c and causing electrical coupling 111 between the pad 118 and the solder ball 121b. With this electrical coupling 111, testing may be performed between the device under test that may be represented by 120b and the testing substrate that may be represented by substrate 115.

This legacy spring probe implementation in a plastic housing 109 has been the main solution for many test houses for years. Although it is mechanically robust, it has a low electrical performance characteristic. This legacy implementation may not scale to meet the needs of future component testing. The legacy spring probe implementation in a shielded metal housing 109 has been recently introduced. It is an evolutionary improvement to the plastic-body version that offers an improved electrical performance as the metal housing offers ground shielding path in isolation between high-speed signals to reduce electrical cross talk. This legacy implementation has an advantage of mechanical robustness, but the cost is a significant trade-off, which can be as much as five times the plastic version or even more. Although the electrical performance is greatly improved over plastic housing 109 spring probe solutions, the shielded spring probe solution may reach its performance limits and may not provide a long term solution. Additionally, undesirable mechanical tradeoffs are associated with these legacy implementations for products with pin pitch less than 0.62 mm. This makes the legacy implementations less mechanically robust and resulting in a higher cost of ownership.

Figure 2:
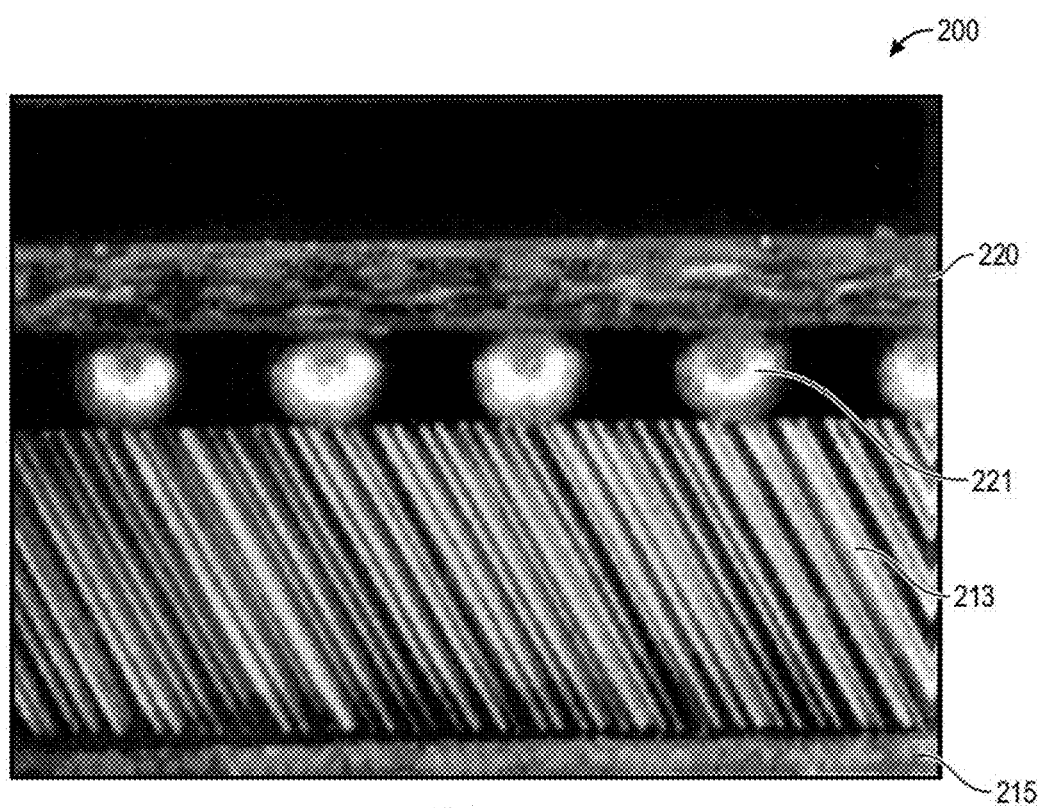
FIG. 2 illustrates another legacy implementation for connecting a package under test to a substrate.

FIG. 2 illustrates another legacy implementation for connecting a package under test to a substrate. Diagram 200 shows a side view cutaway of a device under test 220 that is connected using solder balls 221 against the testing device 215. Wire-embedded-in-elastomer 213 is used to connect the various solder balls 221 with the various active electrical pads (not shown) in the testing device 215. The wire-embedded-in-elastomer 213 legacy approach has the advantage of being low-profile compared to the spring probe discussed above with respect to FIG. 1. Although the low-profile helps electrical performance, the mechanical robustness of this approach is low, which leads to lower reliability and a higher effective cost of ownership similar to that of spring probe using a metal housing due to a higher rate of placement. Reliability of the wire-embedded-in-elastomer 213 legacy approach may also have reliability issues in high-volume test environments due to the degradation of mechanical properties subject to high temperature and high cycles of test resulting from thousands of insertions.

Figure 3:
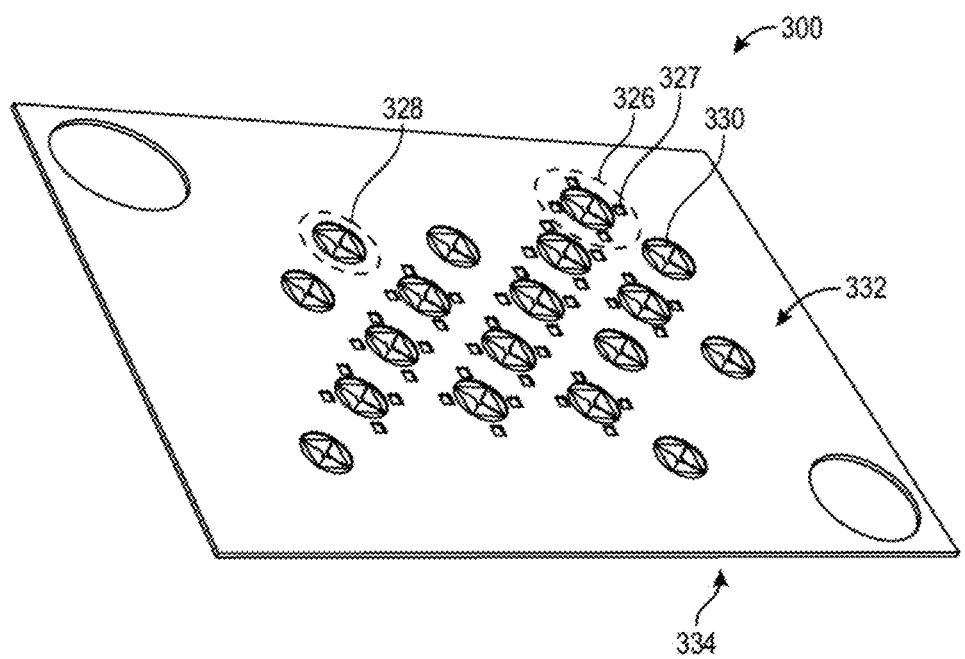
FIG. 3 shows a perspective view of an electrical connector with an insulated conductive layer, in accordance with embodiments.

FIG. 3 shows a perspective view of an electrical connector with an insulated conductive layer, in accordance with embodiments. Diagram 300 shows a perspective view of an interconnect that may provide a high-speed, nonpermanent interconnect with electrical performance that exceeds current legacy implementations at a lower or comparable total cost of ownership. The interconnect 300 has a conductive layer 330 that is sandwiched between a first insulated layer 332 and a second insulated layer 334. In embodiments, these insulated layers may be electrically non-conductive carrier layers to prevent shorts between conductive layer 330 external surfaces, as well as to isolate power and signal contacts as described further below. The interconnect 300 may also be referred to as a cross sectional laminated interconnect.

Contact areas on the interconnect 300 may include contacts within regions 326 that may be electrically isolated from other regions of the conductive layer 330. Contact areas may also include contacts within regions 328 that are electrically coupled with the other regions of the conductive layer 330, for example to provide a ground. It should be appreciated that the geometry of the contacts within regions 326, 328, as well as the geometry of the regions themselves may also be implemented using other geometries. As shown, the regions 326, 328 are circular regions, however other embodiments may be implemented using any other regular shape such as a square, hexagon, ellipse, or the like. Other embodiments may be implemented using irregular shapes. In addition, the shape of the regions 326, 328 may vary among a particular interconnect 300.

The conductive layer 330 may be implemented using a contact sheet, where the contacts in regions 326, 328 may be formed to enable mechanical compliance needed to make electrical contact between connectors of components and/or PCBs. After the lamination of the first insulated layer 332 and the second insulated layer 334 to the conductive layer 330, signal and power contacts, such as found in region 326, are singulated out by removing tabs 327 that electrically connect them to the rest of the contact sheet (as described further below). After singulation, the first insulated layer 332 and the second insulated layer 334, which may be referred to as carrier sheets, hold the contact within the region 326 in place.

Ground contacts, for example contacts within region 328, are not singulated and remain electrically and physically coupled with the rest of the conductive layer 330. This grounded conductive layer 330 surrounding the singulated contacts in region 326 provide superior electrical performance as well as other advantages. These advantages may include enabling tighter impedance control among all the signaling contacts, providing shielding quality similar to the metal housing of the spring probe legacy implementations, and improved power delivery by a ground layer surrounding power contacts.

Figure 4:
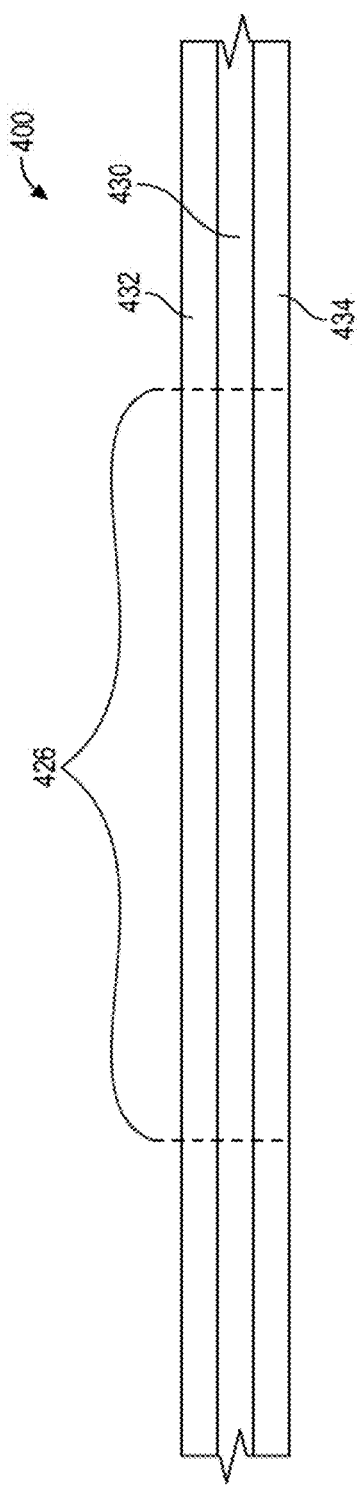
FIG. 4 shows a side view of an electrical connector with an insulated conductive layer, in accordance with embodiments.

FIG. 4 shows a side view of an electrical connector with an insulated conductive layer, in accordance with embodiments. Diagram 400 shows conductive layer 430, first insulated layer 432, and second insulated layer 434, which may be similar to conductive layer 330, first insulated layer 332, and second insulated layer 334 of FIG. 3. The section 426 is similar to section 326 of FIG. 3, and corresponds to an exposed contact area to which a solder ball of the device may be electrically coupled with a pad of a test device as discussed further below.

Figure 5:
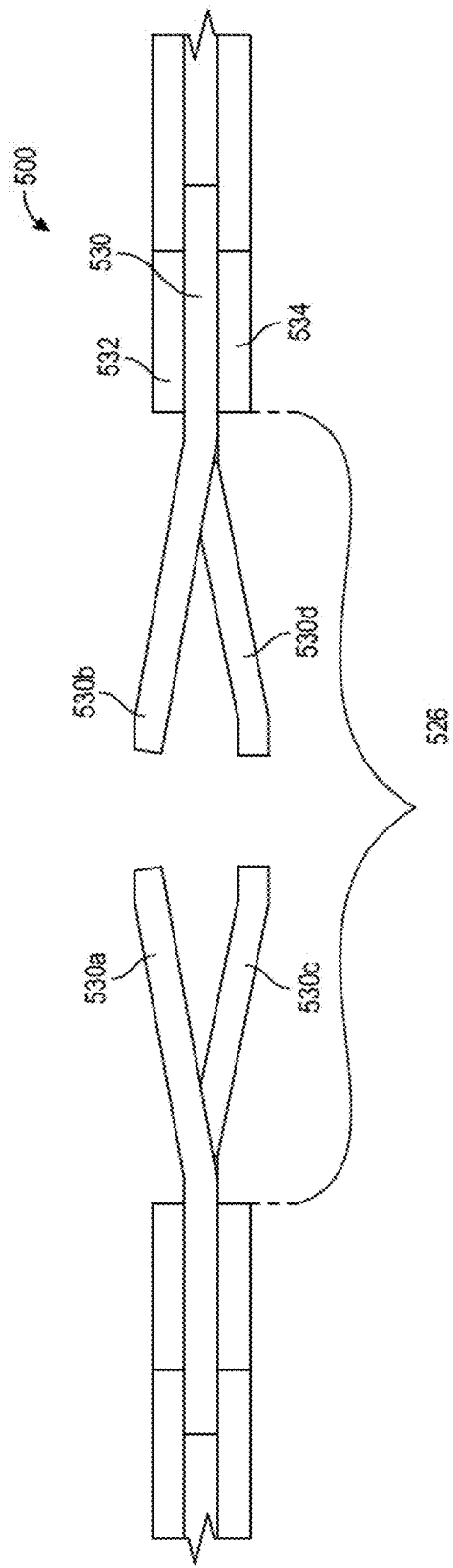
FIG. 5 shows a side view of an electrical connector with an insulated conductive layer, with portions of conductive regions bent away from the conductive layer, in accordance with embodiments.

FIG. 5 shows a side view of an electrical connector with an insulated conductive layer, with portions of conductive regions bent away from the conductive layer, in accordance with embodiments. Insulated layers 532, 534 may be similar to insulated layers 432, 434 of FIG. 4, and conductive layer 530 may be similar to conductive layer 430 of FIG. 4. Diagram 500 shows section 526, which may be similar to section 426 of FIG. 4, where bends in multiple subregions 530a, 530b, 530c, 530d, which may also be referred to as mechanical deflections, in the conductive layer 530 are made to facilitate physical and electrical contact between interconnecting components. These facilitated contacts may also be referred to as compliant contacts. For example, during testing, the interconnecting components may be one or more solder balls of a ball grid array (BGA) of a device under test or a pad of a printed circuit board (PCB) surface.

Figure 6:
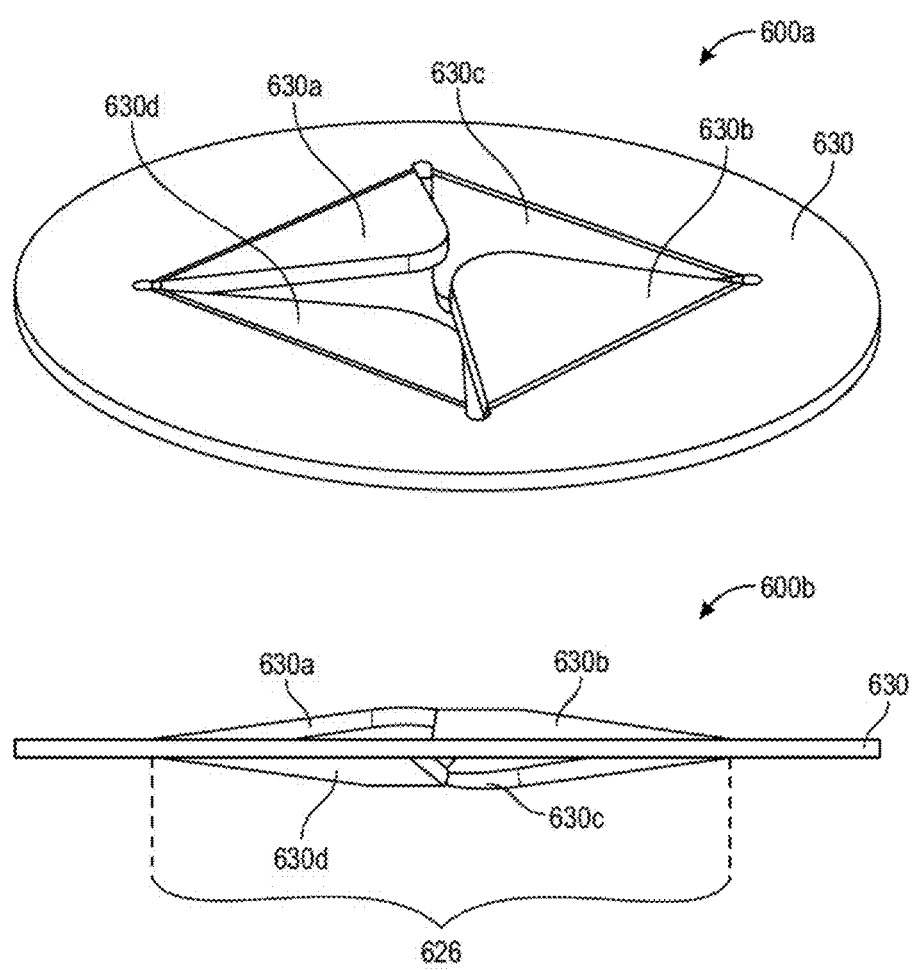
FIG. 6 illustrates a perspective and a side view of raised portions conductive regions, in accordance with embodiments.

FIG. 6 illustrates a perspective and a side view of raised portions conductive regions, in accordance with embodiments. Diagram 600a shows a perspective view of a conductive region 630, which may be similar to conductive region 330 of FIG. 3. Within conductive region 630, there are multiple subregions 630a, 630b, 630c, 630d, which may be similar to subregions 530a, 530b, 530c, 530d of FIG. 5. In embodiments, the subregions may have been defined by etching or stamping in the conductive region 630, in this case in a X-pattern. In this embodiment, there are two subregions 630a, 630b are mechanically deflected upwards, and two subregions 630c, 630d are mechanically deflected downwards. In embodiments, once this deflection is performed, the resulting layer may be treated to preserve the deflection to maintain physical force against a device contact when applied. In embodiments, this treatment may include heat treatment or chemical treatment, Diagram 600b shows a side view of the conductive region 630, where subregions 630a, 630b are mechanically defected upward, and subregions 630c mechanically deflected downward. The section 626 of the region 630 may be similar to the section 526 of FIG. 5. The subregions 630a, 630b, 630c, 630d may be shaped for an optimal physical and electrical interface with different types of connectors or connector surfaces, for example a land grid array, a solder bump or solder ball, and the like, to make reliable electro/mechanical connections with a wide range of electrical component and printed circuit board interfaces.

Figure 7:
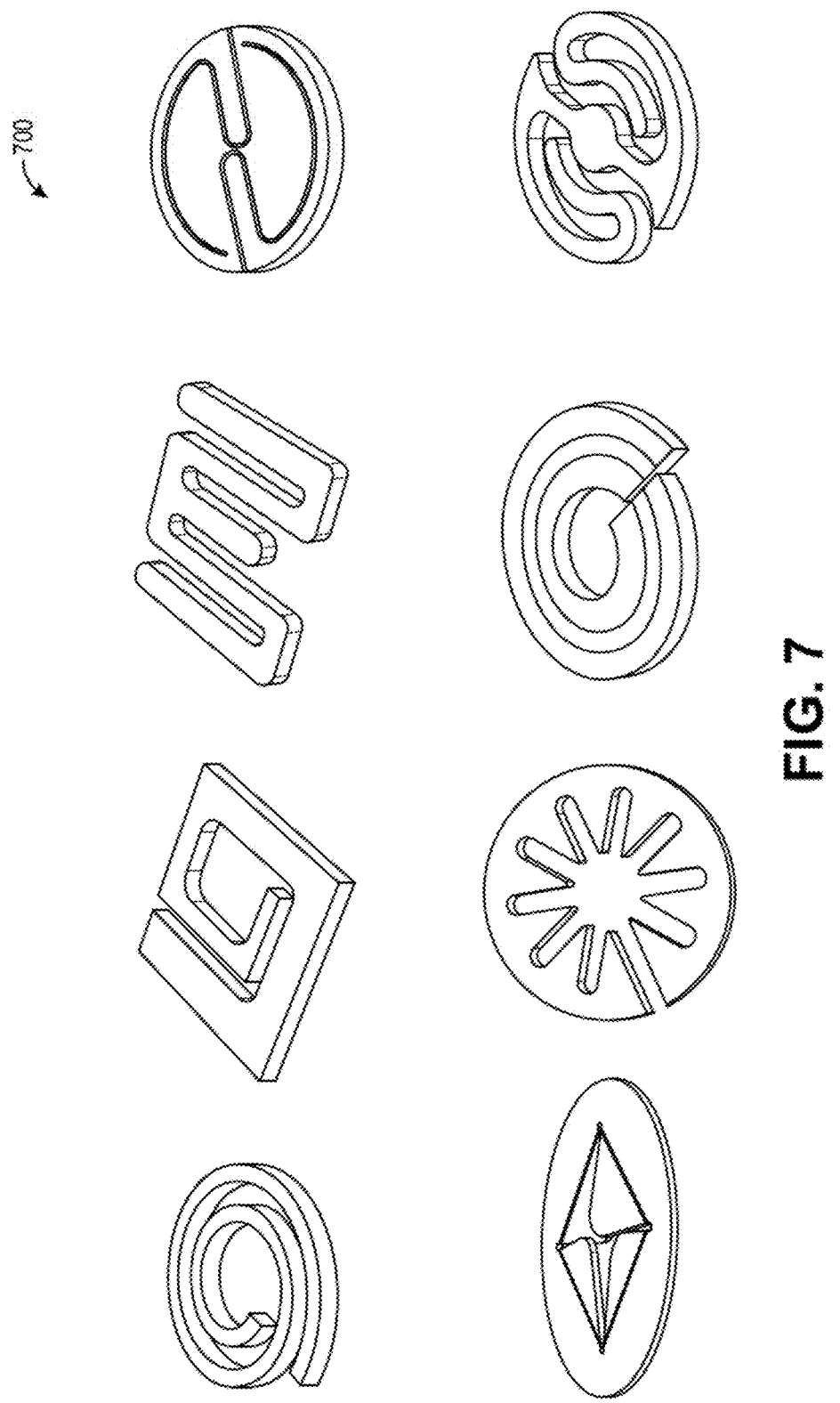
FIG. 7 shows examples of geometries of portions of conductive regions that may be bent away from the conductive layer, in accordance with embodiments.

FIG. 7 shows examples of geometries of portions of conductive regions that may be bent away from the conductive layer, in accordance with embodiments. Diagram 700 shows examples of eight different geometries into which subregions, which may be similar to subregions 630a, 630b, 630c, 630d of FIG. 6, may be formed and bent to create mechanical deflections. A particular pattern and deflection may be chosen based on alternative contact geometries that may offer slightly different properties with respect to mechanical compliance and effective compression force against the connector. The flexibility of the subregion design, particular the area of the subregion that comes into contact with the connector, also provides multiple ways for optimizing electrical performance. In embodiments, a contact point may be shaped so that it provides a scrubbing action across day land grid array pad to breakthrough foreign material and oxidation that may be on the pads. In other embodiments, pin tips may be shaped to penetrate solder flux and other foreign material on PGA solder balls. In other embodiments, the contact area may be customized to increase the contact area and reduce the contact resistance.

Figure 8A:
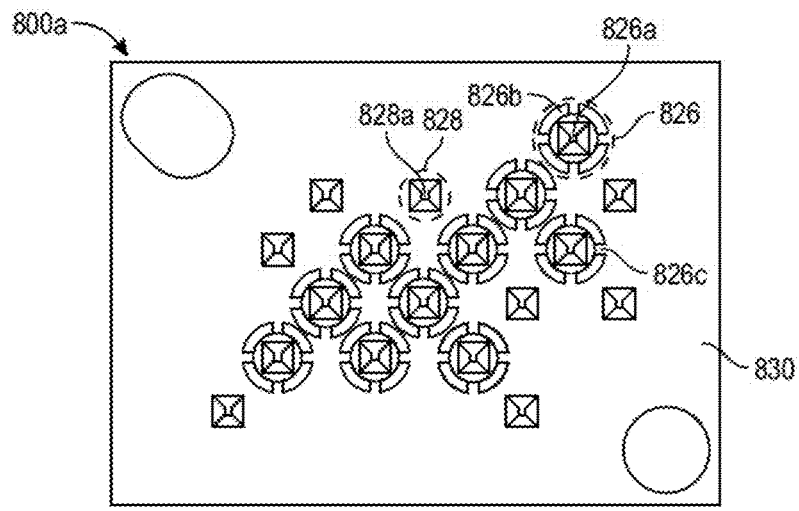
FIGS. 8A-8C illustrate examples of various stages of manufacture of an electrical connector with an insulated conductive layer, in accordance with embodiments.
Figure 8B:
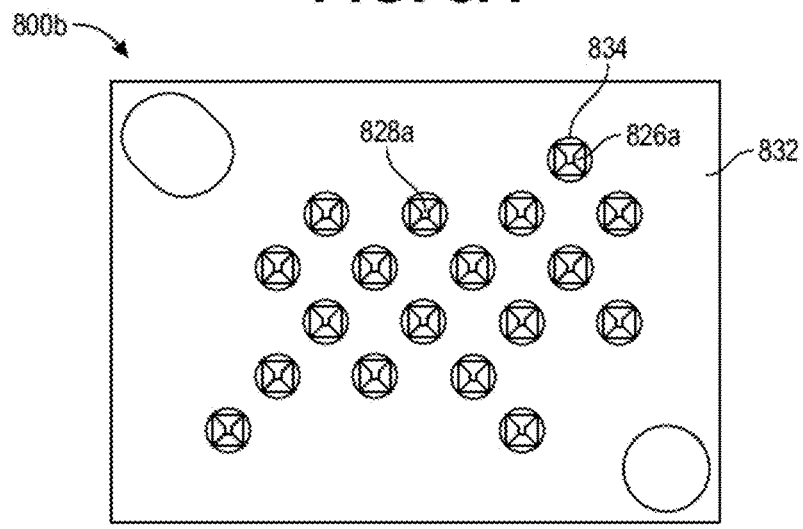
Figure 8C:
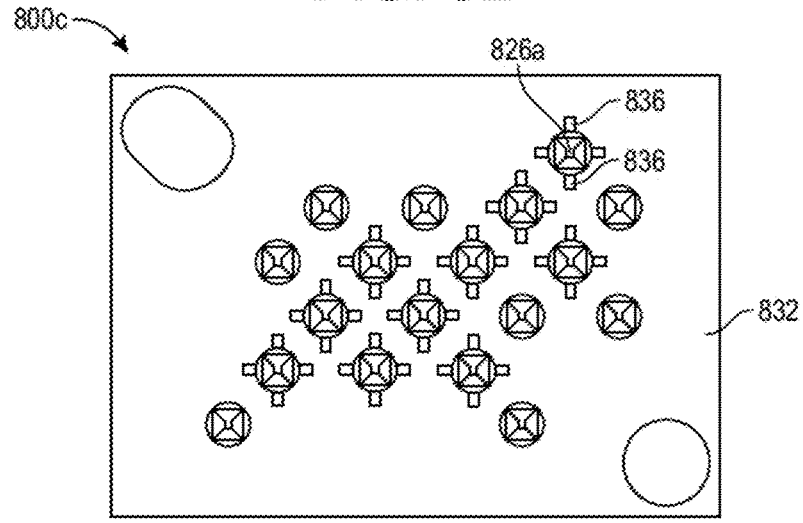

FIGS. 8A-8C illustrate examples of various stages of manufacture of an electrical connector with an insulated conductive layer, in accordance with embodiments. FIG. 8A shows a top view of an initial action in a process to create an electrical connector with an insulated layer. Diagram 800a illustrates an example of a conductive layer 830, which may be similar to conductive layer 530 of FIG. 5. In embodiments, the conductive layer 830 may have a thickness ranging from 10 µm to 75 µm. The conductive layer 830 includes regions 826 that will become singulated contacts 826a that will be electrically isolated from the rest of the conductive layer 830. A structure for this isolation may be formed by creating openings 826b that partially surround the contacts 826a, leaving bridge connections 826c that allow the contacts 826a to remain physically coupled with the conductive layer 830 during the lamination process. Subsequently, during singulation as discussed below in FIG. 8C, these bridge connections 826c will be removed. The conductive layer 830 may also include regions 828 that will become contacts 828a that will be electrically coupled with the rest of the conductive layer 830. In examples, the contacts 828a may become ground contacts. The contacts 826a, 828a, and the openings 826b may be formed by laser cutting, etching, or electroforming.

FIG. 8B includes diagram 800b that shows a top insulator layer 832 coupled with the conductive layer 830. A second insulator layer (not shown) is coupled with the opposite side of the conductive layer 830. Note that areas 834 have been cut from the insulator layer 832 to expose the contacts 826a, 828a, but to not expose the openings 826b or the bridge connections 826c.

FIG. 8C includes diagram 800c that shows punches 836, which may also be referred to as cutouts, that are made to remove the bridge connections 826c that provided electrical and physical connection between the singulated contact 826a and the rest of the conductive layer 830. In embodiments, the punches 836 may be made by physical punches, by laser cutting, or by some other removal process. After these bridge connections 826c have been removed, the singulated connection 826a will be electrically isolated from the rest of the conductive layer 830. At this point, a first contact of a first device and a second contact of a second device may be coupled, respectively, with a top surface and a bottom surface of the singulated contact 826a and will be electrically coupled with no other electrical interference from the rest of the conductive layer 830.

Figure 9:
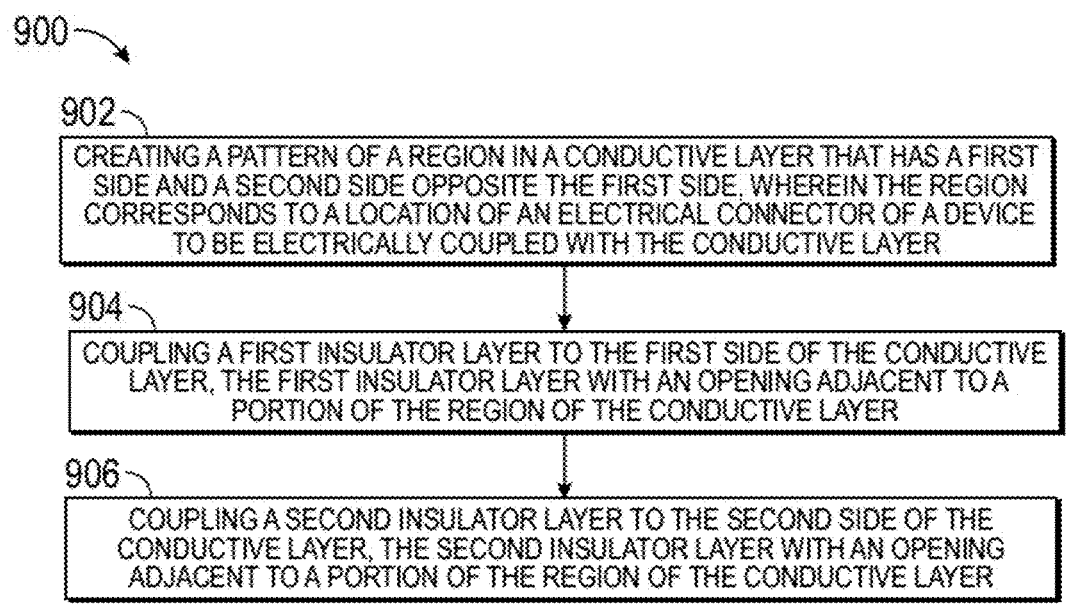
FIG. 9 illustrates an example of a process to manufacture an electrical connector with an insulated conductive layer, in accordance with embodiments.

FIG. 9 illustrates an example of a process to manufacture an electrical connector with an insulated conductive layer, in accordance with embodiments. The process 900 may be implemented using one or more techniques as described with respect to FIGS. 1-8 and 10.

At block 902, the process may include creating a pattern of a region in a conductive layer that has a first side and the second side opposite the first side, where in the region corresponds to a location of an electrical connector of a device to be electrically coupled with the conductive layer. In embodiments, the conductive layer may correspond to conductive layer 330 of FIG. 3, 430 of FIG. 4, 530 of FIG. 5, 630 of FIG. 6, or 830 of FIG. 8A. The patterning of a region in the conductive layer may correspond to contacts 826a, 828a, and openings 826b partially surrounding the contacts 826a of FIG. 8A. The patterning of the conductive layer may be performed through laser cutting, laser or chemical etching, or electroforming. In embodiments, after the patterning, the conductive layer may be plated to become more durable and corrosion resistant. Plating may support electrical high-speed conductivity, increased durability of contact points, by making them harder, and increasing corrosion resistance. In embodiments, gold plating may be used as an outer layer with an underlying nickel layer for mechanical bonding, In addition, other geometries and other aspects of the contacts 826a, 828a, may be formed, and shown with respect to contacts 530a, 530b, 530c, 530d of FIG. 5 or contacts 630a, 630b, 630c 630d of FIG. 6, or shown by the various examples of FIG. 7. In embodiments, a forming tool may be used for part of or all of the conductive layer, which may include deflections of the contacts 630a, 630b, 630c 630d of FIG. 6. The forming process using a forming tool may be a mechanical process to bend the material bought beyond its plastic range.

At block 904, the process may further include coupling a first insulator layer to the first side of the conductive layer, the first insulator layer with an opening adjacent to a portion of the region of the conductive layer. In embodiments, this insulator layer may correspond to insulator layer 332 of FIG. 3, or 832 of FIG. 8B. In embodiments, regions such as region 834 of FIG. 8B may be cut from the first insulator layer 832 to expose contacts 826a, 828a.

At block 906, the process may further include coupling the second insulator layer to the second side of the conductive layer, the second insulator layer with an opening adjacent to a portion of the region of the conductive layer. In embodiments, this insulator layer may correspond to insulator layer 332 of FIG. 3. In embodiments, regions such as region 834 of FIG. 8B may be cut from the first insulator layer 832 and the second insulator layer to expose contacts 826a, 828a.

Subsequent actions in the process may include punching or cutting out sections to create singulated contacts. In embodiments, the punches may include punches 836 of FIG. 8C, as discussed above.

Figure 10:
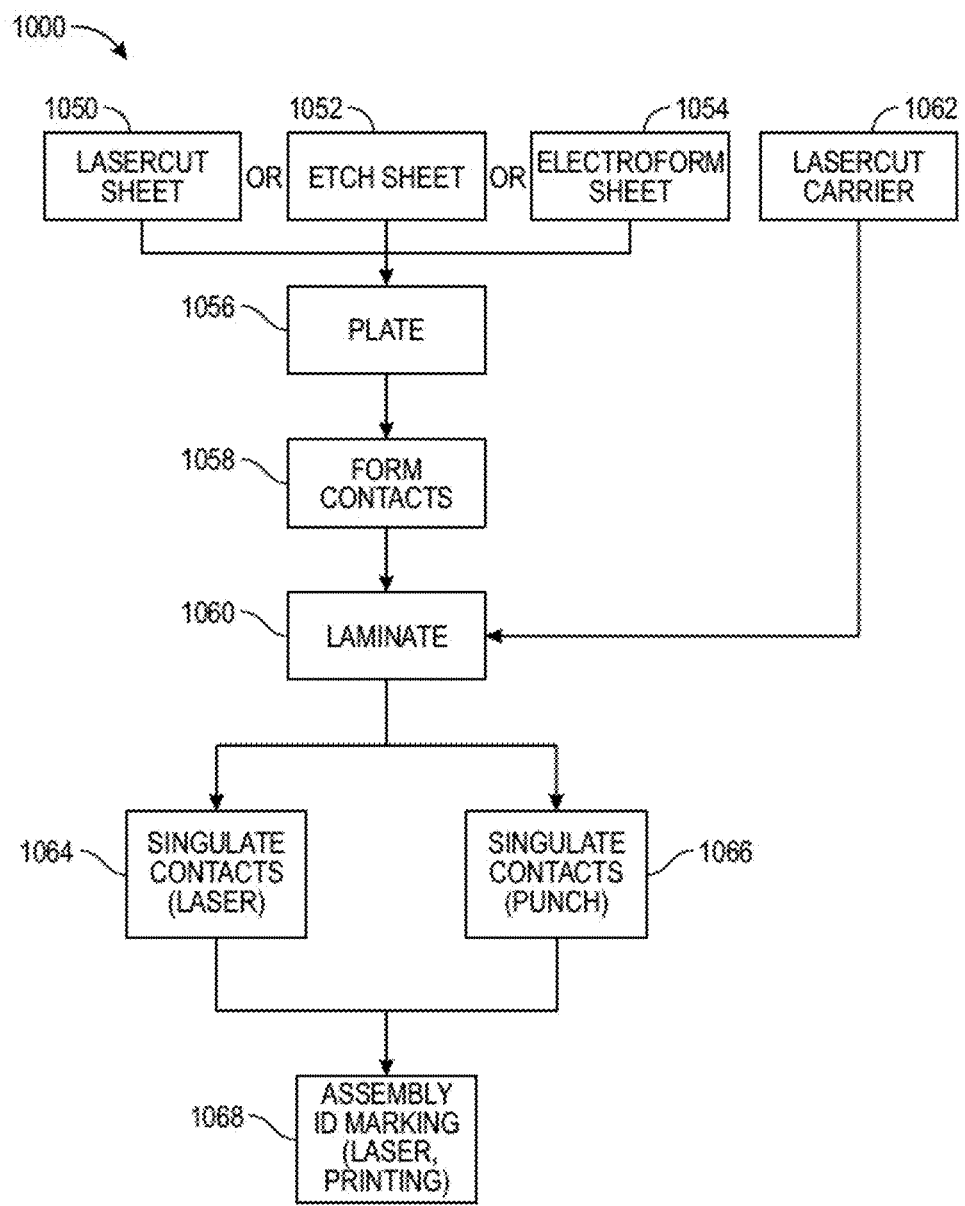
FIG. 10 illustrates an example of another process to manufacture an electrical connector with an insulated conductive layer, in accordance with embodiments.

FIG. 10 illustrates an example of another process to manufacture an electrical connector with an insulated conductive layer, in accordance with embodiments. Diagram 1000 shows a process with components that may be applied to a conductive layer, which may be referred to as a conductive sheet, and which may correspond to conductive layer 530 of FIG. 5. First, the sheets may be laser cut 1050, etched 1052, or electroforming 1054 to create a pattern in the sheet. In embodiments, this pattern may be similar to patterning as shown in diagram 800a of FIG. 8A. Subsequently, a plating process 1056 may be applied to the pattern sheet to provide more durability and corrosion resistance.

Subsequently, contacts may be formed 1058 using a stamping or a cutting process. In embodiments, the resulting contacts may be similar to contacts 530a, 530b, 530c, 530d of FIG. 5, contacts 630a, 630b, 630c, 630d of FIG. 6, or various example contacts as shown with respect to FIG. 7.

Subsequently, lamination 1060 may be applied. In embodiments, this includes applying the first insulator layer to the first side and the second insulator layer to a second side of the conductive layer. In embodiments, the first insulator layer may correspond to first insulator layer 332 of FIG. 3, or 832 of FIG. 8B. The second insulator layer may correspond to second insulator layer 334 of FIG. 3. In embodiments, laser cutting 1062 may be applied to the first insulator layer and the second insulator layer to form regions, such as regions 834 of FIG. 8B, that after lamination expose contacts such as contacts 826a of FIG. 8B.

After lamination 1060, contacts may be singulated using a laser process 1064 or a punch process 1066. In embodiments, this creates punches 836 of FIG. 8C, as discussed above. Finally, the resulting unit may be applied with assembly identification marking 1068 to identify the resulting interconnect pattern. In embodiments, the marking may be accomplished either by laser etching or printing.

It should be noted that, when implemented as a manufacturing process with respect to FIG. 9 or FIG. 10, this process may be done with features appropriate for a second-level interconnect pitch, for example in one embodiment 0.3 mm and above. These processes also lend themselves to parallel manufacturing, which may reduce manufacturing cost.

FIGS. 11-15 illustrate example performance estimates, including electrical performance estimates based on simulations. The simulations use a layout that may represent a typical mobile device central processing unit (CPU) pin map configuration with an effective pin-to-pin pitch of 0.430 mm. Simulation set up and pin map are the same for all simulation runs. Vendor provided models were used for elastomer and spring probe designs.

Figure 11:
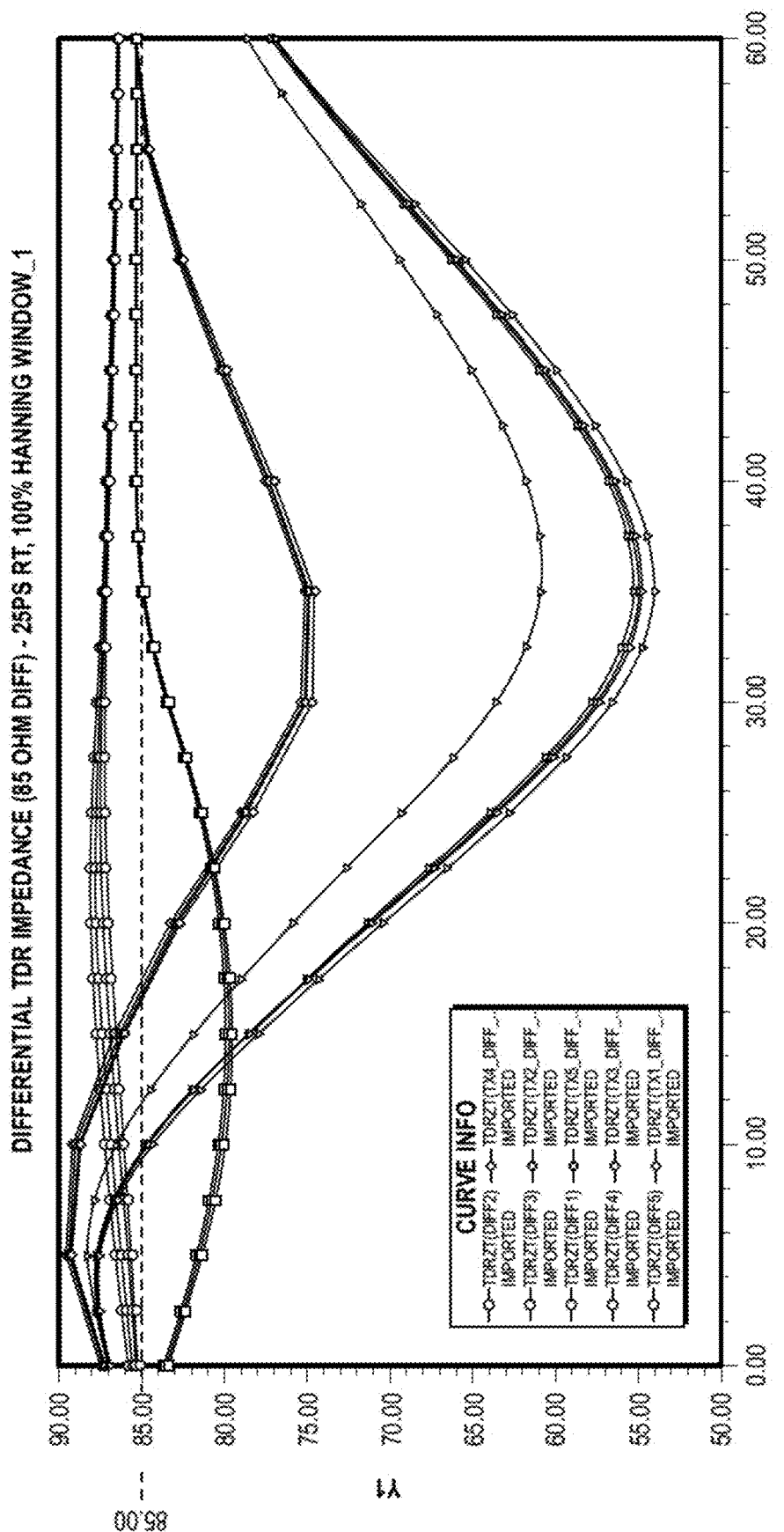
FIG. 11 illustrates a graph of differential impedance comparison results, in accordance with embodiments.

FIG. 11 illustrates a graph of differential impedance comparison results, in accordance with embodiments. FIG. 11 shows that impedance variation between signals in the invention is very small compared to other solutions. Tight impedance control is important in the test interconnect for ensuring consistent electrical performance across all data paths in the interconnect interface. Because the test socket is the one physical structure in the electrical channel that is not present in the end customer electrical channel, the design objective is for the electrical impact to be minimal and equally effect all signals in an interface. Embodiments described herein are the best at achieving the objective. If the test interconnect causes even one signal in an interface to perform differently than the other signals, the unit under test could falsely fail. Additionally, the mechanical architecture of embodiments described herein allows more degrees of freedom to adjust the mechanical geometries to optimize the impedance to a desired target.

Figure 12:
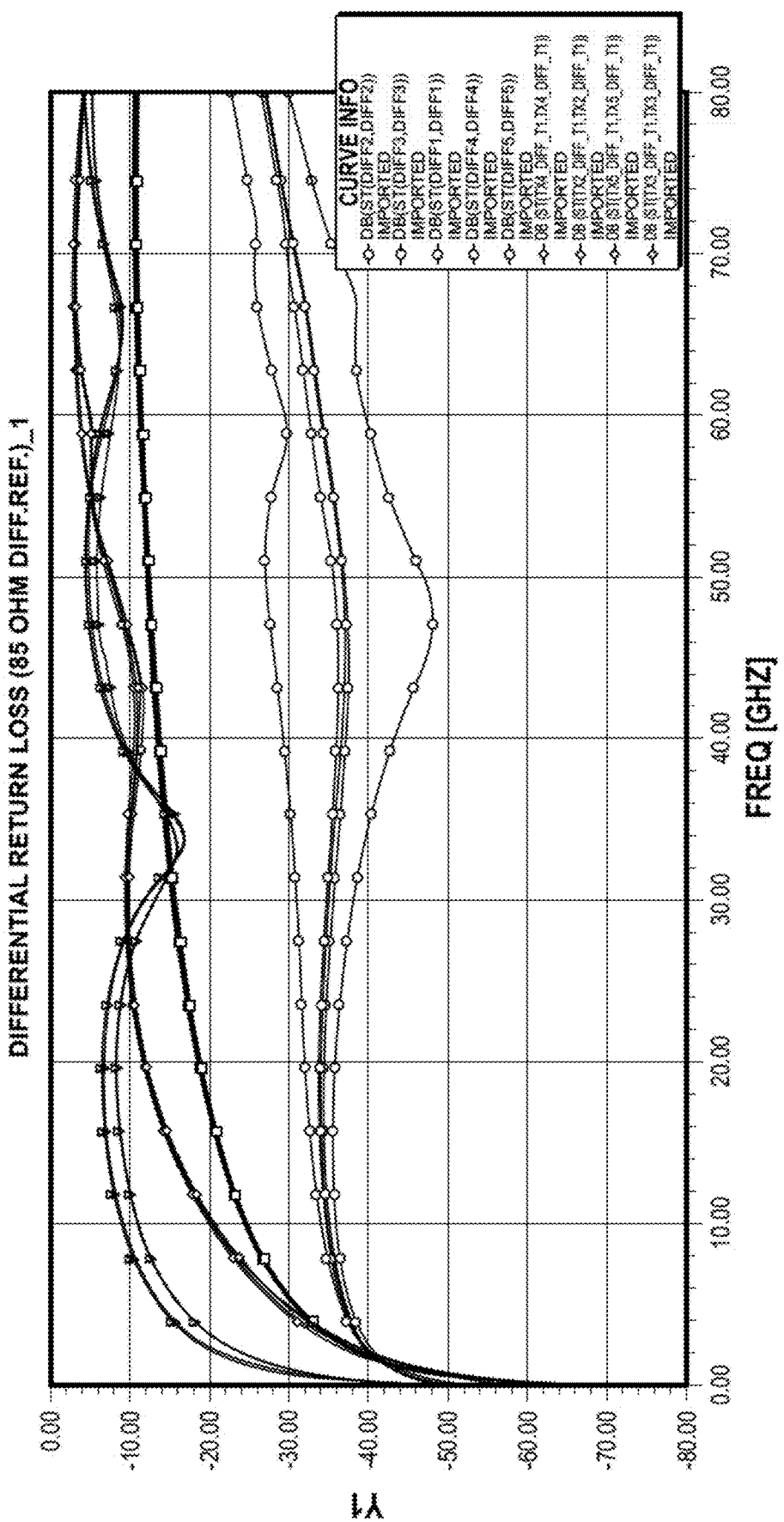
FIG. 12 illustrates a graph of return loss comparison results, in accordance with embodiments.

FIG. 12 illustrates a graph of return loss comparison results, in accordance with embodiments. FIG. 12 shows that return loss of embodiments described herein is also tightly controlled with no resonances up to 80 GHz. Return loss performance is closely tied to how well the impedance of the structure is matched to the reference, or system, impedance; in this case 85 ohms differential. Adjustments to the mechanical geometries of embodiments could be made to more closely match the reference impedance and improve the return loss to be similar to the elastomer.

Figure 13:
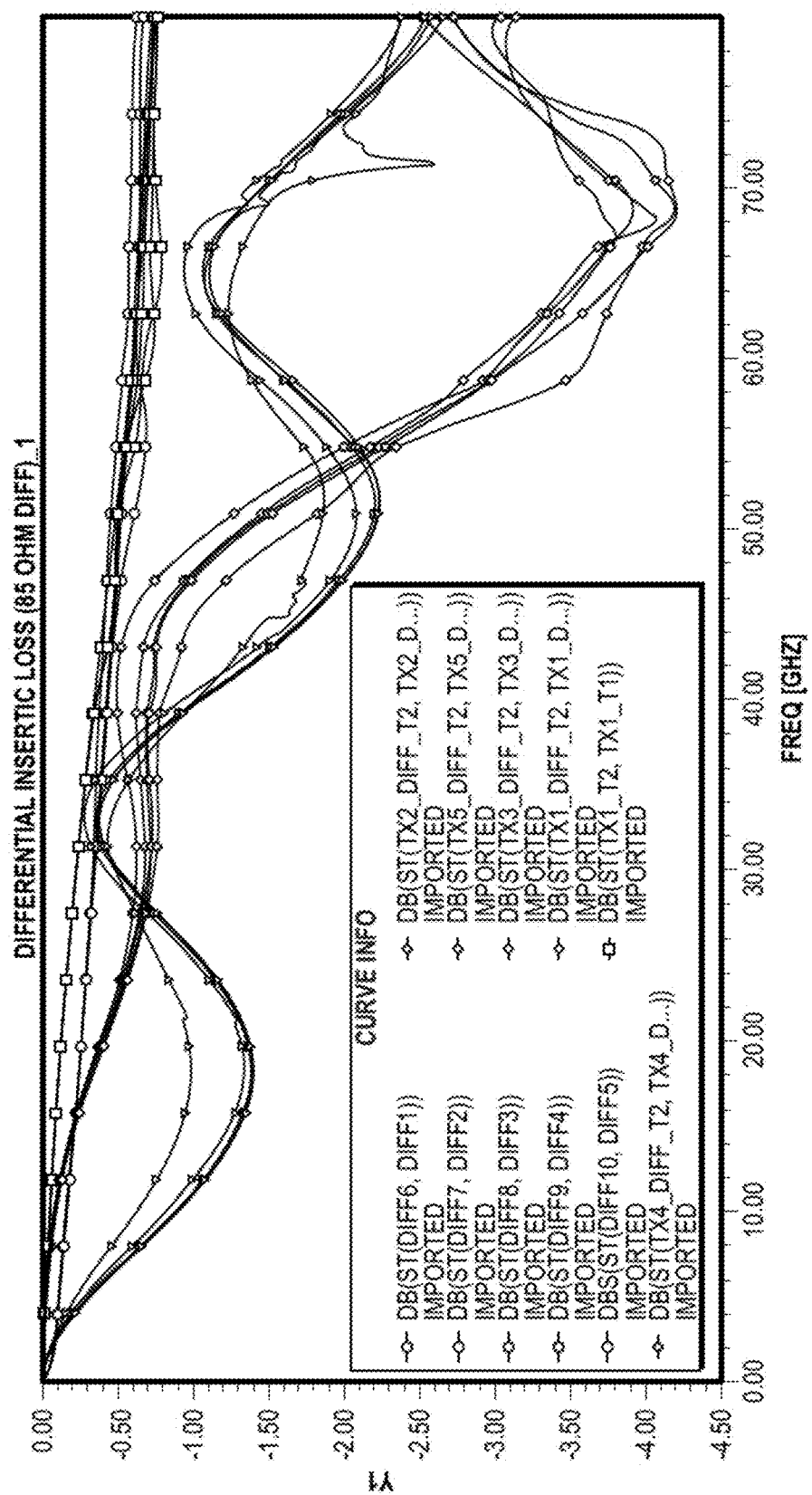
FIG. 13 illustrates a graph of differential insertion loss comparisons, in accordance with embodiments.

FIG. 13 illustrates a graph of differential insertion loss comparisons, in accordance with embodiments. FIG. 13 shows that in some embodiments the insertion loss performance of the invention is on par with the best legacy solution (elastomer), and far exceeds spring probe based solutions. The superior bandwidth of embodiments described herein allows higher speed signals to be transmitted with minimal amplitude loss. Furthermore, the shape and phase of the signal will be better maintained with the invention since higher frequency harmonics of the signal will not be significantly attenuated.

Figure 14:
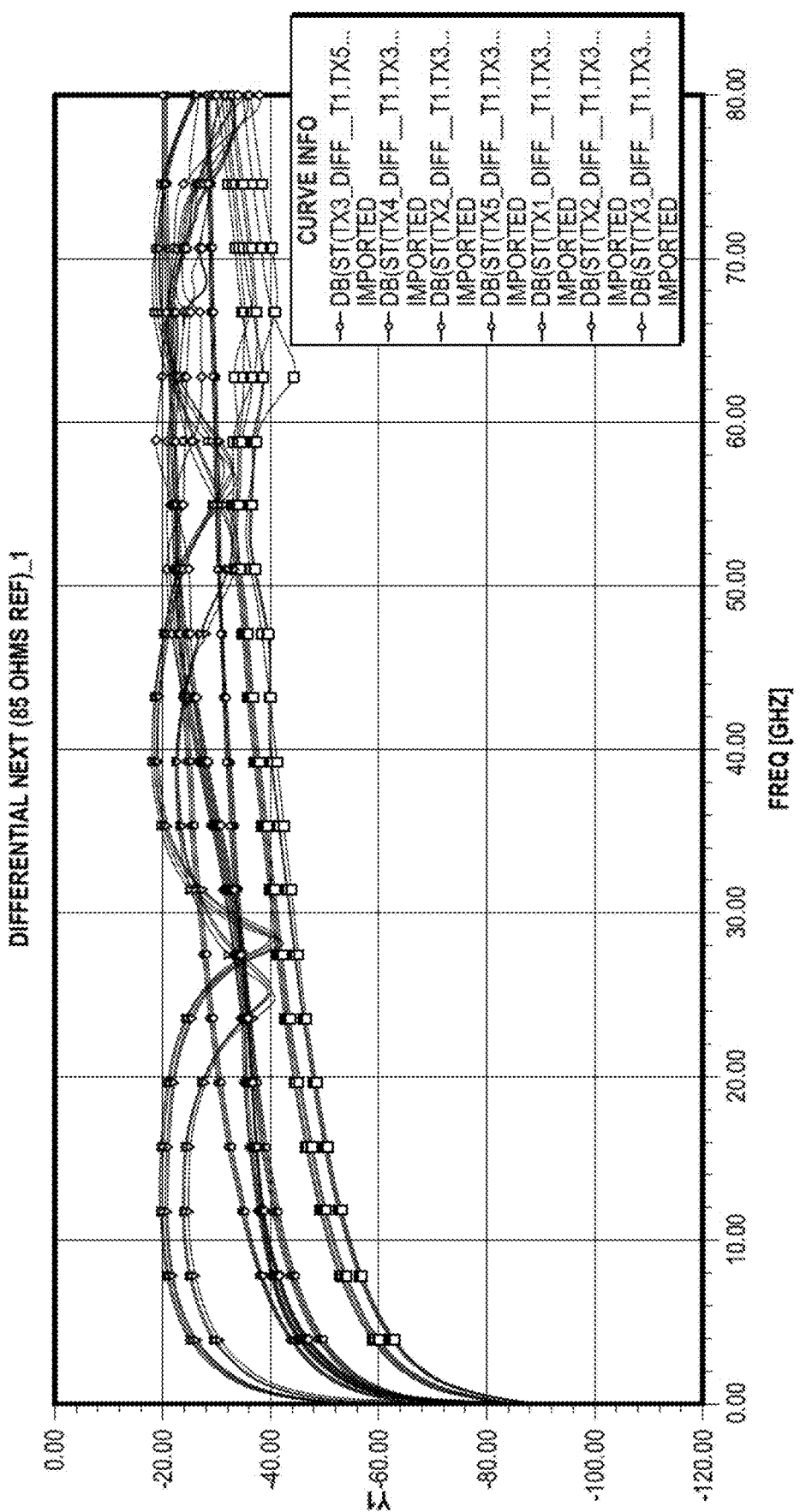
FIG. 14 illustrates a graph of differential near-end crosstalk comparisons, in accordance with embodiments.
Figure 15:
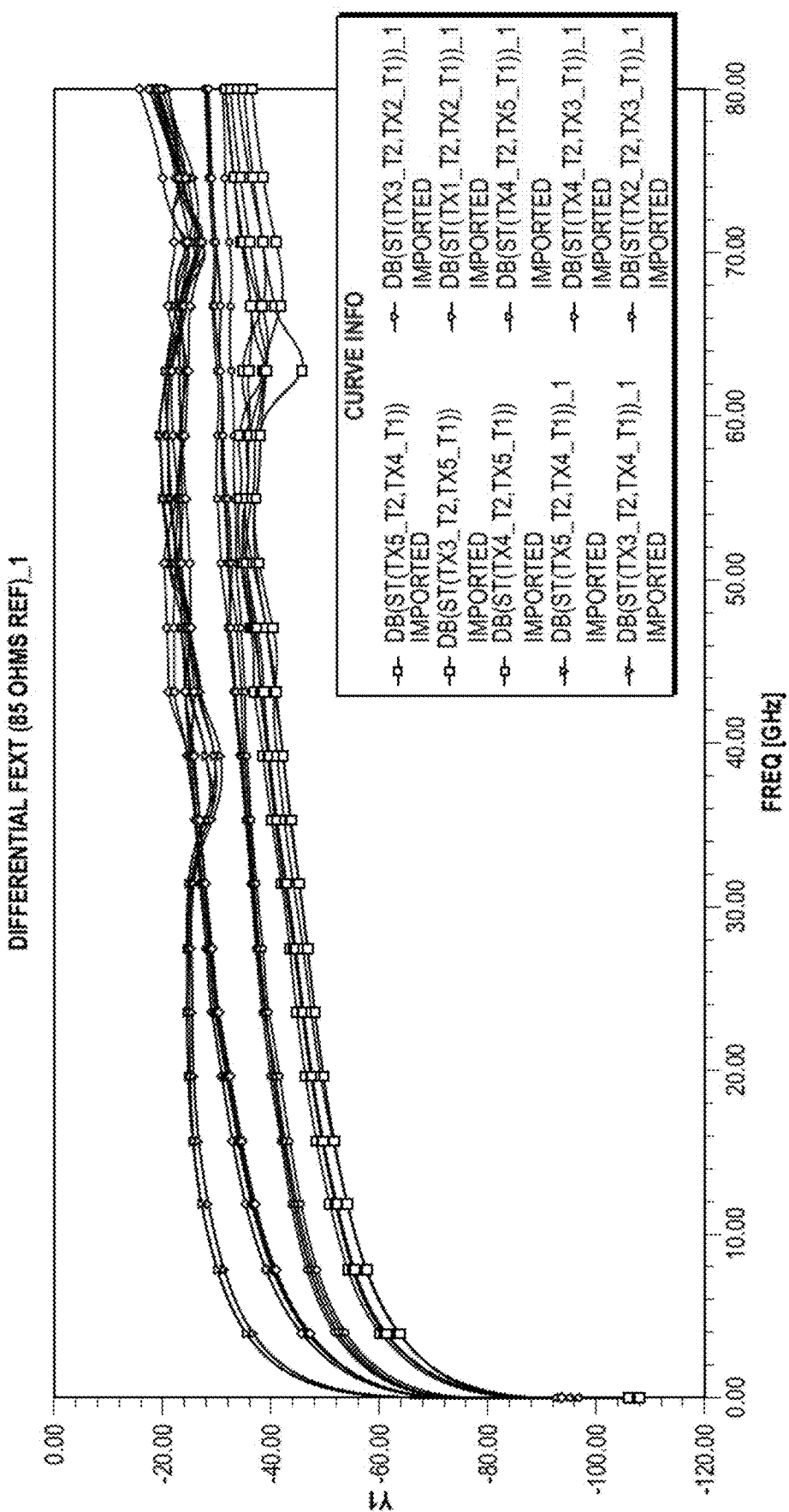
FIG. 15 illustrates a graph of differential far-end crosstalk comparisons, in accordance with embodiments.

FIG. 14 illustrates a graph of differential near-end cross-talk comparisons, in accordance with embodiments, and FIG. 15 illustrates a graph of differential far-end cross-talk comparisons, in accordance with embodiments. FIGS. 14-15 show that embodiments described herein may provide the best cross-talk performance of all legacy implementations. Embodiments may provide a 12-15 db reduction in coupling noise; or ~75-80% decrease in coupled voltage. In the test environment, cross-talk has shown to be the most disruptive impairment to signaling because it cannot be mitigated by equalization circuitry in the I/O.

Figure 16:
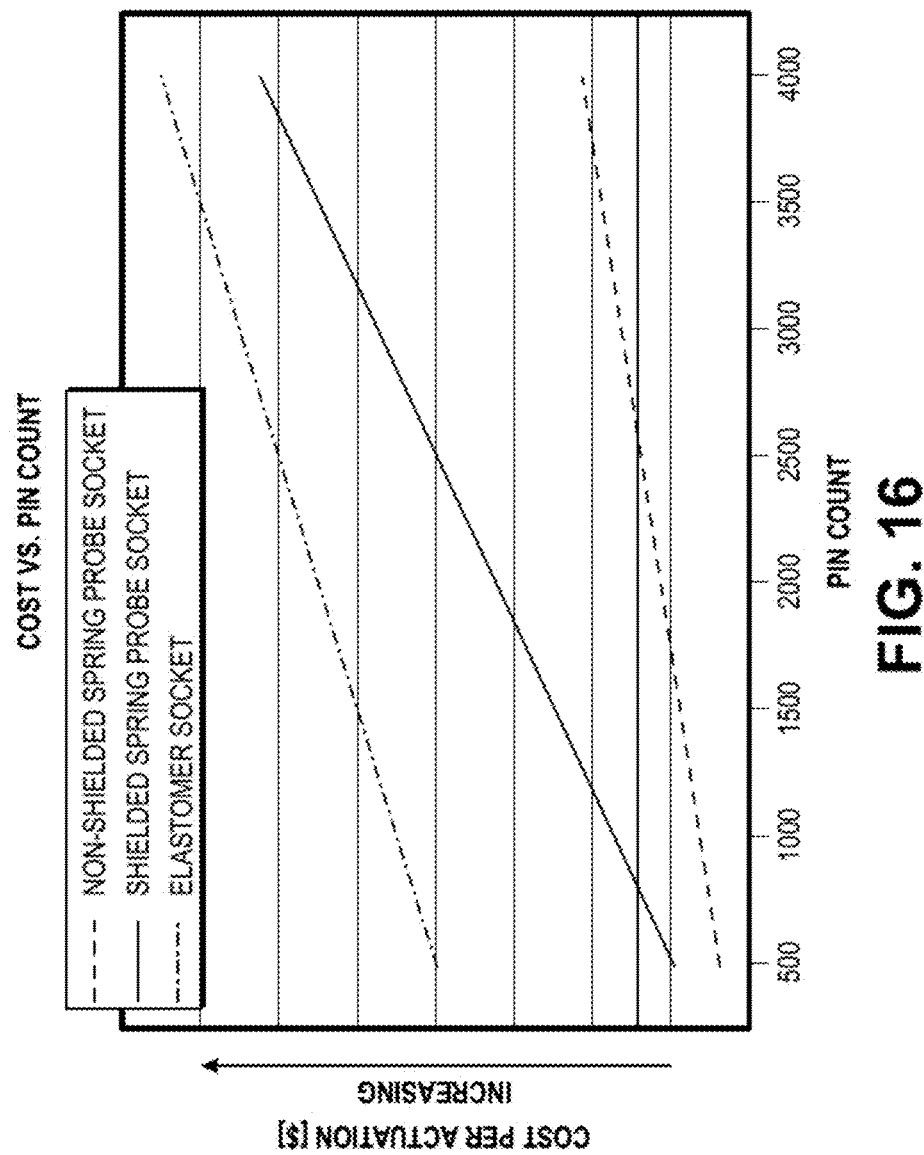
FIG. 16 illustrates a graph of cost comparisons with legacy implementations, in accordance with embodiments.

FIG. 16 illustrates a graph of cost comparisons with legacy implementations, in accordance with embodiments. Unlike legacy implementations where the cost of a test socket is a function of the pin count, embodiments described herein allow for parallel manufacturing of the interconnect, such the interconnect of diagram 300 of FIG. 3, thereby making the cost of manufacture relatively insensitive to pin count. The graph shows approximate cost for current technologies and their direct correlation to pin count.

For all pin counts, the legacy elastomer implementations as shown with respect to FIG. 2 is expected to be more expensive—and cost is increasing as pin count increases. Similarly, the legacy shielded spring probe socket has shown with respect to FIG. 1 is expected to be more expensive as pin count exceeds 2500 pins. While the non-shielded spring socket is less expensive for lower pin counts, the electrical performance is far inferior and likely to impact test yield negatively.

Figure 17:
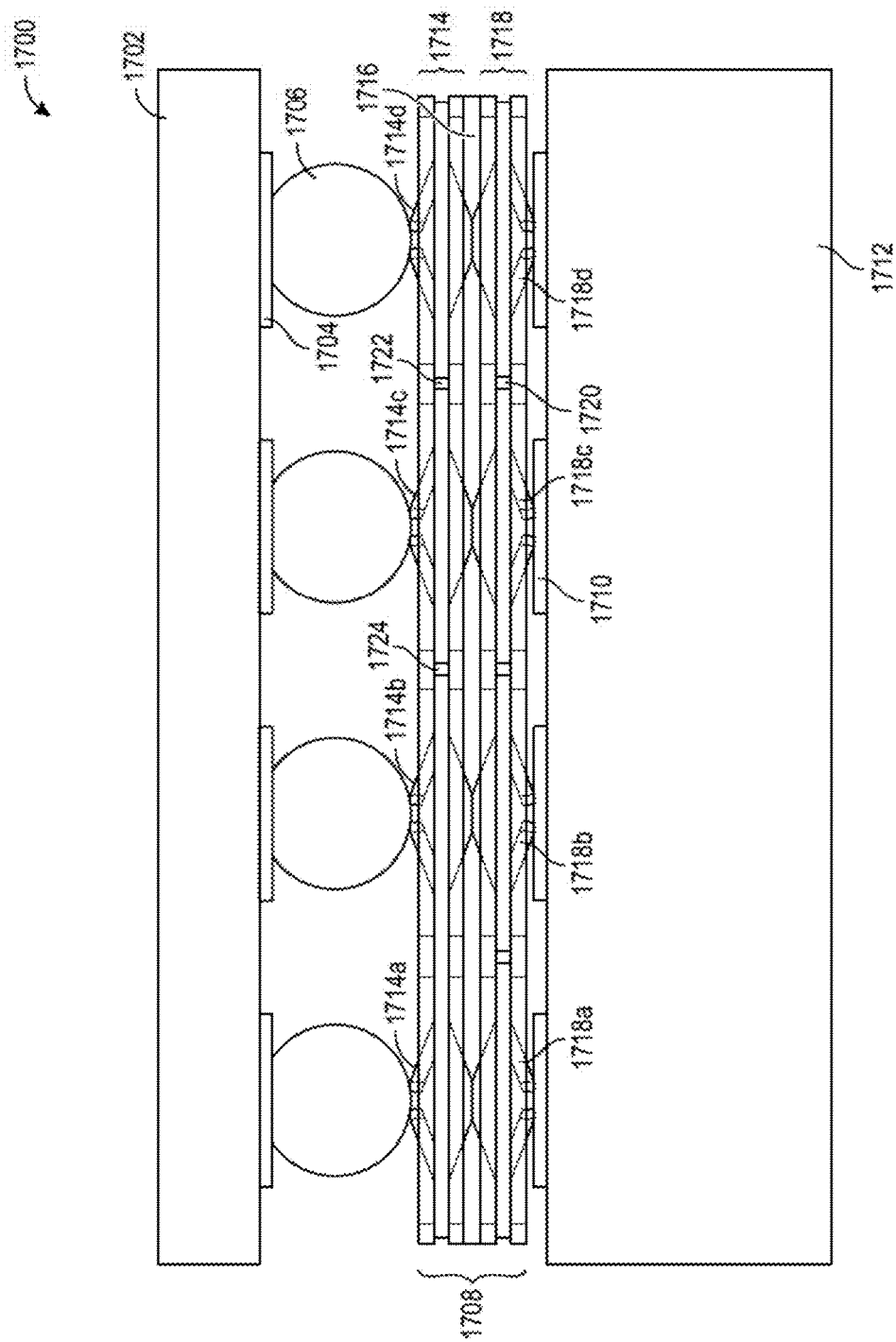
FIG. 17 illustrates a side view of an example of a two layer insulated conducting electrical connector, in accordance with embodiments.

FIG. 17 illustrates a side view of an example of a two layer insulated conducting electrical connector, in accordance with embodiments. Diagram 1700 shows an implementation of a multilayer interconnect 1708 that includes a first interconnect layer 1714 and a second interconnect layer 1718 that is coupled between a dielectric sheet 1716. In embodiments, the dielectric sheet 1716 may include open regions to allow electrical coupling between the first interconnect layer 1714 and the second interconnect layer 1718. In embodiments, the first interconnect layer 1714 and the second interconnect layer 1718 may be similar to interconnect 300 as described with respect to FIG. 3.

As shown, an IC package 1702 that includes pads 1704 with which solder balls 1706 are attached, may be coupled with the first interconnect layer 1714 at connection points 1714a, 1714b, 1714c, 1714d. The first interconnect layer 1714 may include a conductivity layer, that may be similar to conductivity layer 530 of FIG. 5, with at least some of the connection points 1714a, 1714b, 1714c, 1714d singulated with regions 1722, 1724, as described above with respect to diagram 800c of FIG. 8C. Signal connection point 1714c and power connection point 1714d may be singulated from first interconnect layer 1714 with regions 1722 and 1724. Singulated signal connection point 1714c may form a double stacked signal connection when bonded with signal connection point 1718c. Singulated power connection point 1714d may form a double stacked power connection when bonded with power connection point 1718d. Ground connection points 1714a, and 1714b are not singulated from first interconnect layer 1714 and once individually bonded to ground connection points 1718a and 1718b, may form two double stacked ground connections. In embodiments, first interconnect layer 1714 may be a ground plane.

The second interconnect layer 1718 maybe coupled with various contacts 1710, which may be electrical pads, that are coupled with a motherboard 1712. The second interconnect layer 1718 may include a power plane layer, that may be similar to conductivity layer 530 of FIG. 5, with the least some of the connection points 1718a, 1718b, 1718c, 1718d simulated with regions 1720, as described above with respect to diagram 800c of FIG. 8C. Ground connection points 1718a and 1718b, as well as signal connection point 1718c are singulated from the second interconnect layer 1718 with regions 1720, and in embodiments may include other regions (not shown). Singulated ground connection points 1718a and 1718b may form two double stacked ground connections when individually bonded to ground connection points 1714a and 1714b. Singulated signal connection point 1718c may form a double stacked signal connection when bonded with signal contact point 1417c. Power connection point 1718d is not singulated from power layer 1718 and forms a double stacked power connection when bonded to power contact point 1714d.

Figure 18:
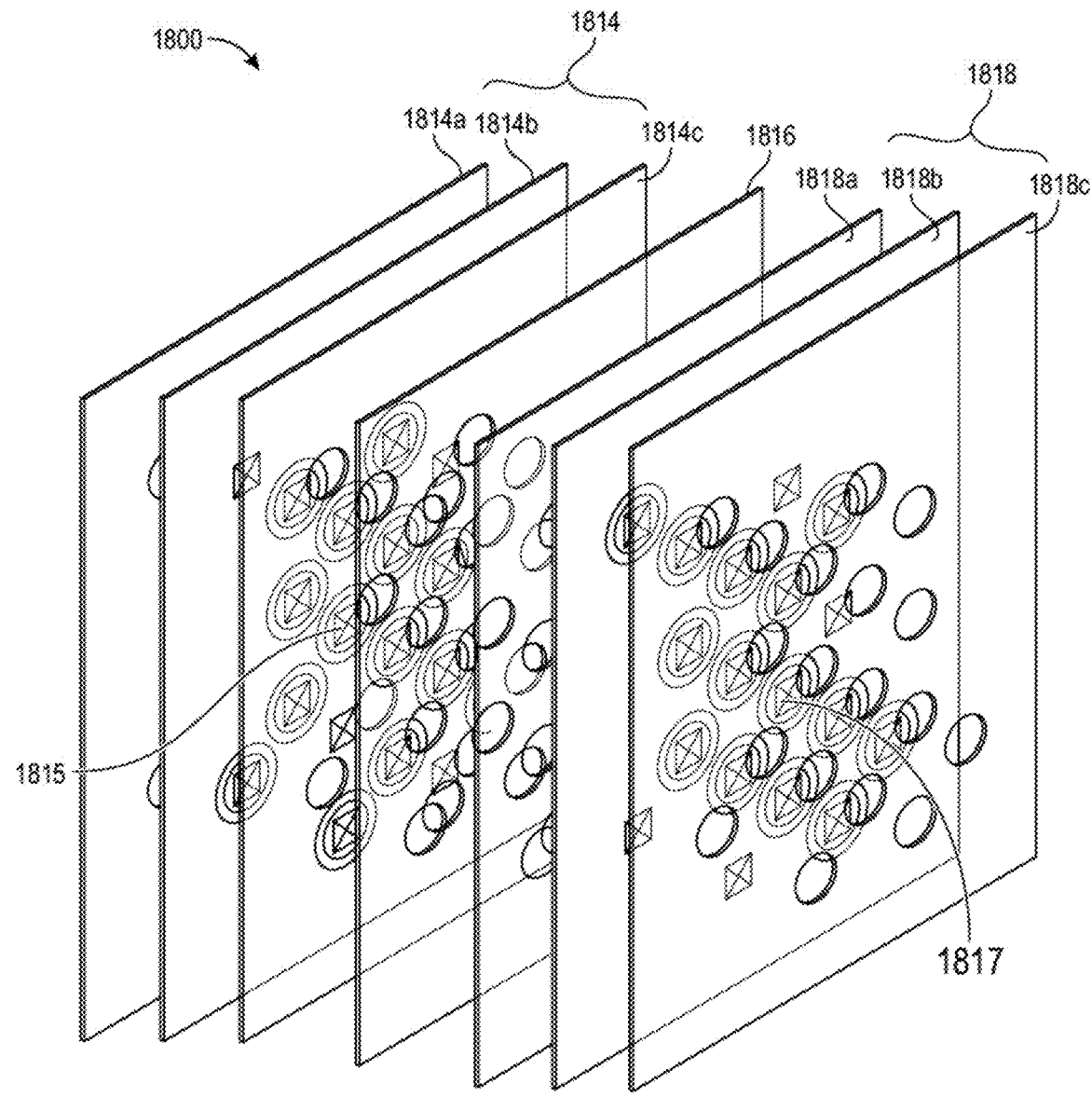
FIG. 18 illustrates an exploded, perspective view of an example two layer insulated conducting electrical connector, in accordance with embodiments.

FIG. 18 illustrates an exploded, perspective view of an example two layer insulated conducting electrical connector, in accordance with embodiments. Diagram 1800 includes the first interconnect layer 1814, which may be similar to first interconnect layer 1714 of FIG. 17, second interconnect layer 1818 may be similar to second interconnect layer 1718 of FIG. 17, and dielectric sheet 1816 which may be similar to dielectric sheet 1716 of FIG. 17. In embodiments, insulator sheets 1814a, 1814c may be laminated to ground plane 1814b, and insulator sheets 1818a, 1818c may be laminated to power plane 1818b. In embodiments, the insulator sheets may be referred to as insulator layers, or as carrier sheets. Contacts 1815 are shown on the first interconnect layer 1814, which may either be singulated or non-singulated as described above. Contacts 1817 are shown on the second interconnect layer 1818, which may be either singulated or non-singulated. Open regions in the dielectric sheet 1816 may allow electrical conductivity between various contacts 1815 on the first interconnect layer 1814 and various contacts 1817 on the second interconnect layer 1818. In embodiments, the dielectric sheet 1816 may be omitted.

In embodiments, signal contact with the solder ball such as solder ball 1706 of FIG. 17, form a contact 1815 that may be singulated. A power contact may be formed by electrically coupling a contact 1815 that is singulated on the first interconnect layer 1814 with a corresponding contact 1817 that is not singulated (therefore has a power voltage) on the second interconnect layer 1818 by spot bonding the contacts 1815, 1817. If a dielectric sheet 1816 is included, then the spot bonding will be through an open region (not shown) in the dielectric sheet 1816.

A signal contact may be formed by electrically coupling a contact 1815 that is singulated on the first interconnect layer 1814 with a corresponding contact 1817 that is also singulated on the second interconnect layer 1818 by spot bonding the contacts 1815, 1817. A ground contact may be formed by electrically coupling a contact 1815 that is not singulated on the first interconnect layer 1814 with a corresponding contact 1817 that is singulated on the second interconnect layer 1818 by spot bonding the contacts 1815, 1817.

Advantage of a two layer implementation is that plane capacitance can be designed into embodiments to improve power delivery performance that would normally be significantly degraded by the inductance inherent in interconnects. In addition, placement of decoupling capacitance may be an important factor to the performance of the systems power delivery network. In embodiments, capacitance will be placed next to the silicon so that it can very quickly supply current during instantaneous current demands. Embodiments may put some additional capacitance right under the current load in the device under test. In embodiments, the following is an example of how much plane capacitance can be added to a power delivery network with just one square centimeter of plate area. Plate capacitance for 1 cm² plate area; $C=(\epsilon 0 * \epsilon r * w * l)/h$; C=capacitance; $\epsilon 0$=permittivity of free space=0.225 pf/in; $\epsilon r$=relative permittivity (dielectric constant) of the dielectric layers=2.7-3.4; w=width of plate area; l=length of plate area; h=total thickness of dielectric layers between sheet planes; $C=(0.225 \text{ pf/in} * 2.7 * 0.394 \text{ in} * 0.394 \text{ in})/0.00093 \text{ in}$; C=101.4 pf.

Figure 19:
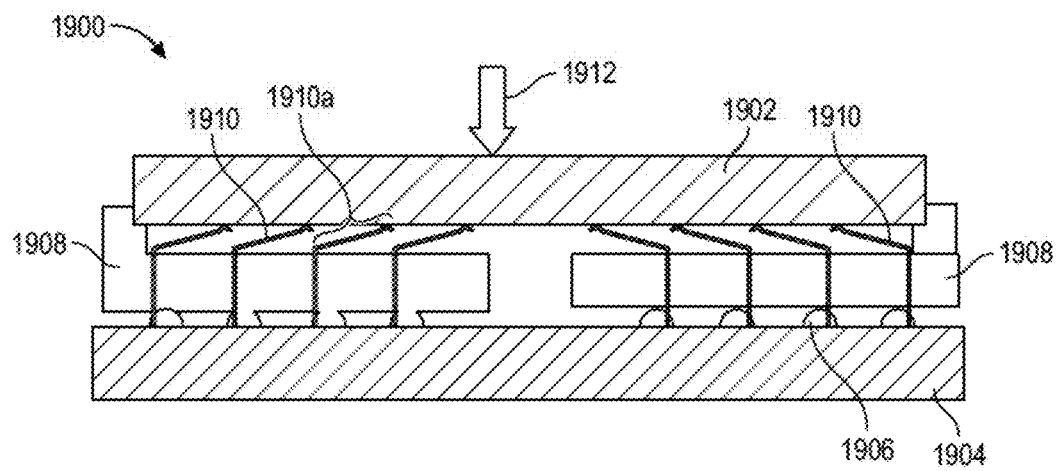
FIG. 19 illustrates a legacy implementation of a package connector.

FIG. 19 illustrates a legacy implementation of a package connector. Diagram 1900 shows a package 1902 that is coupled with socket 1908 with pins 1910 electrically coupled with the package 1902. The socket 1908 is also electrically coupled to a motherboard 1904 using BGA connections 1906. As shown the pins 1910 may be a land grid array (LGA) of pins with the cantilever beam 1910a to provide contact compliance. In these legacy implementations, beam length 1910*a* limits pitch reduction, for example beyond 350 μm. In addition, this legacy implementation may require a sustained load/force 1912 to ensure stable electrical connections between the pin contacts 1910*a* and pads 1906 on the package 1902.

In embodiments, a separate mechanism (not shown) may be required to apply the sustained load/force onto the package 1902. This requirement of high load on the package 1902, when it has a high pin count, may also lead to device failure. In addition, this legacy approach does not "self-center" the package 1902 upon insertion onto the pins 1910, and is limited by positional tolerances for fine pitch.

Figure 20:
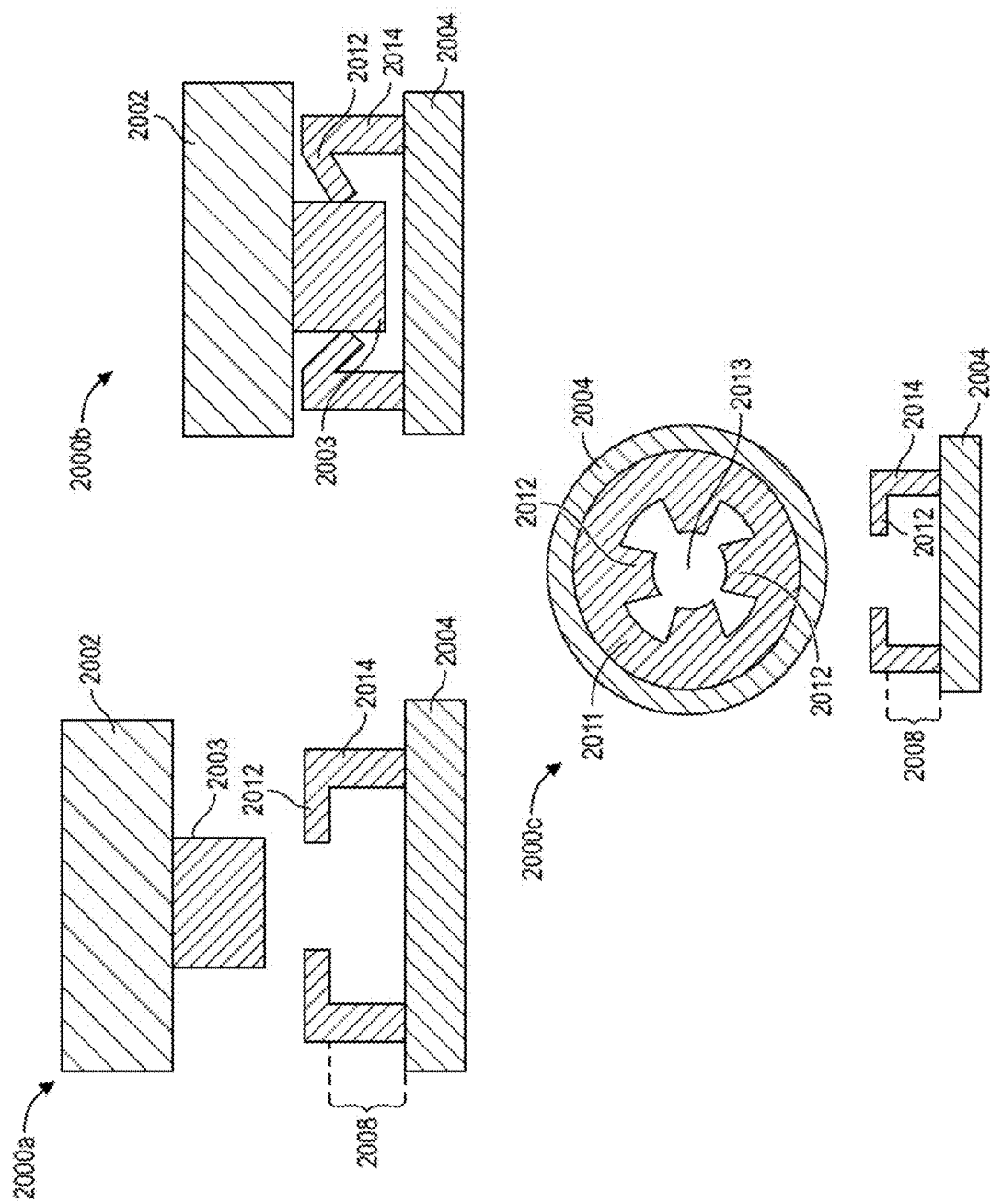
FIG. 20 illustrates top and side views of a tabbed electrical connector, in accordance with embodiments.

FIG. 20 illustrates top and side views of a tabbed electrical connector, in accordance with embodiments. Diagram 2000*a* shows a portion of a package 2002 that has a connector 2003 attached prior to insertion into a tabbed electrical connector 2014. The tabbed electrical connector 2014 has a cylinder portion 2008 and a tab portion 2012 that is part of a plate 2011 attached to the cylinder portion opposite a substrate 2004. In embodiments, the package 2002 may be an IC chip, CPU, etc. The connector 2003 is a three-dimensional structure such as a pillar, solder ball, or pin that is attached to the package 2002 and can be inserted into the opening 2013 of the plate 2011. The opening 2013 allows pin mechanical compliance such that tabs 2012 can bend to accommodate connector 2003 and thereby create electrical connections. In embodiments, tab 2012 will provide a reaction force, acting as a spring while 2003 is inserted. In embodiments, the plate 2011 together with the opening 2013 may be referred to as a split ring implementation. In embodiments, tabbed electrical connector 2014 may be made by traditional metal manufacturing for coarser pitches, as well as plating, lithography, or etching for finer pitches.

Advantages of these embodiments include low insertion force (LIF) sockets scalable to less than a 100 μm pitch. These embodiments also provides self-centering during seating due to multiple point connections each with centered openings 2013 within plates 2011. This is beneficial for alignment and positional tolerances compared to legacy LGA/LIF. In embodiments, the barrel 2014 acts as a guide while centered openings 2013 bends and forces connector 2003 into the center of the barrel. This insertion technique assists in centering the entire array. Legacy LGA packages do not have an alignment guide, thus the contact may slip off the pad. In addition, the simple and low profile structural geometry of embodiments allows better impedance control over legacy contact designs that may be used for high-speed applications with spectral content in excess of 80 GHz. In addition, multilayer geometry enables force modulation with different materials and layers. In embodiments, each layer may be individually designed to accommodate application requirements. For example, one layer may use a high modulus material such as Nickel alloy to increase contact force while using a copper layer to aid in electrical performance. Also, embodiments may enable impedance tuned "coax" type for a high speed interconnect due to the cylindrical nature of various components. In embodiments, this type of cylindrical design allows better impedance control and provision for ground shield to reduce the overall electrical losses and cross talk compared to legacy LGA/LIF due to their complicated geometry. Advantages of embodiments described herein include support for higher bandwidth signal communication and faster processing speeds.

Diagram 2000*b* shows the connector 2003 inserted into the tabbed electrical connector 2014. During insertion, the tabs 2012 of the tabbed electrical connector 2014 may bend down toward the substrate 2004, and secure to the connector 2003 and provide resistance to make it difficult to subsequently remove the connector 2003 from the tabbed electrical connector 2014. The securing, which involves pressing the tab portion 2012 against the connector 2003, helps to maintain a robust electrical and physical connection between the package 2002 and the substrate 2004.

Diagram 2000*c* shows a top view of the plate 2011 that includes an opening 2013 proximate to a centerline of the cylinder 2008, with tabs 2012 of the plate 2011 notched toward the center of the hole 2013. In embodiments, the tabbed electrical connector 2014 may be made of copper, or some other suitable material such as Nickel-based alloys, palladium, rhodium, and the like.

Figure 21A:
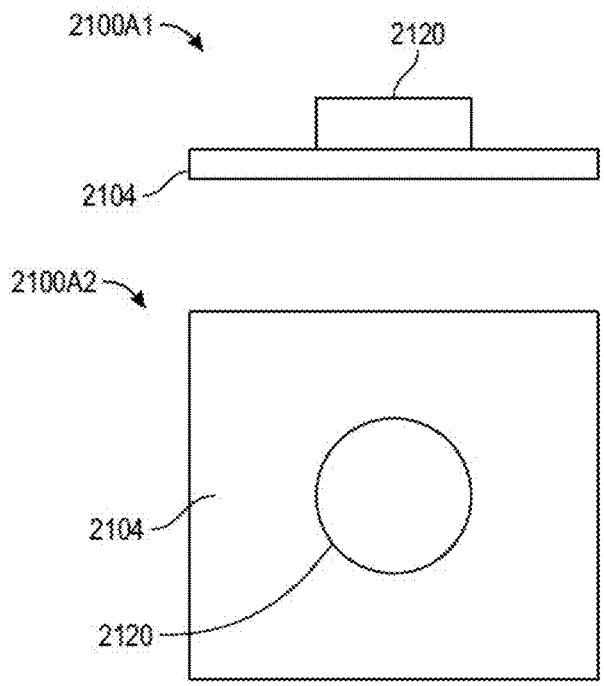
FIGS. 21A-21F illustrate side and top views of various stages of manufacture of a tabbed electrical connector, in accordance with embodiments.

FIGS. 21A-21F illustrate side and top views of various stages of manufacture of a tabbed electrical connector, in accordance with embodiments. These manufacturing techniques using plating and etching may result in structures that enable tab sockets with a fine pitch due to better control of tolerances over legacy manufacturing techniques such as stamping, forming, and assembly. In FIG. 21A, diagram 2100A1 shows a side view of a substrate 2104, which may be similar to substrate 2004 of FIG. 20, with a circular copper pad 2120 placed on the substrate 2104. In embodiments, the copper pad 2120 may be placed using, for example, electroless plating, or with electroplating the entire structure as one piece then selectively etching to isolate the center region. Diagram 2100A2 shows a top-down view of the circular copper pad 2120 placed on the substrate 2104.

Figure 21B:
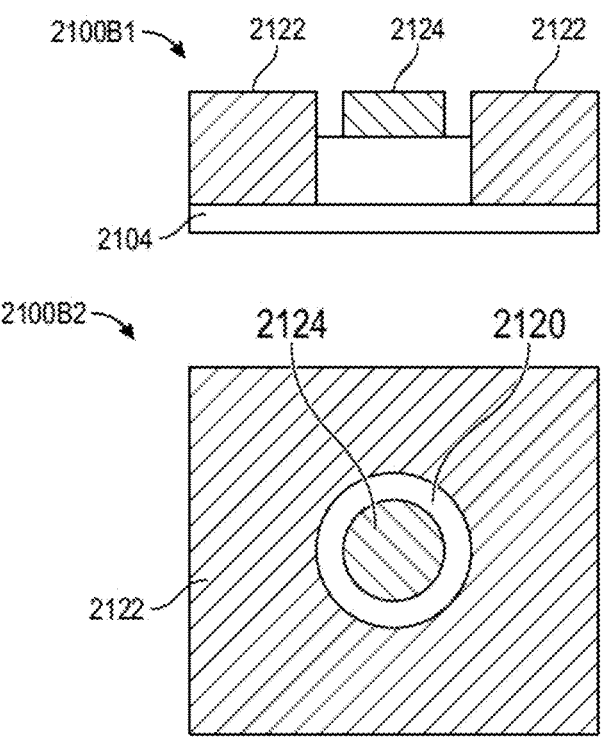

In FIG. 21B, diagrams 2100B1 and 2100B2 show a resist layer 2122 placed on the outside of the circular copper pad 2120 on the substrate 2104, and a resist layer 2124 placed in the middle of the copper pad 2120. The resist layer 2124 will form the inside of the resulting cylinder.

Figure 21C:
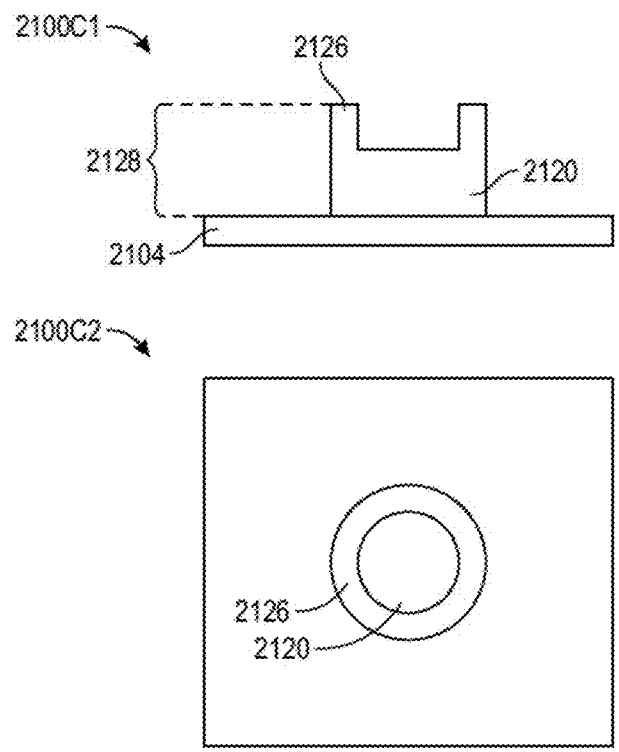

In FIG. 21C, diagrams 2100C1 and 2100C2 show the copper deposition 2126 on the copper pad 2120 to form the sides of the cylinder wall. The resist 2122 and 2124 have been removed, for example by etching. In embodiments, the actions in FIG. 21B and FIG. 21C can be repeated multiple times to increase the height of the copper cylinder structure 2128.

Figure 21D:
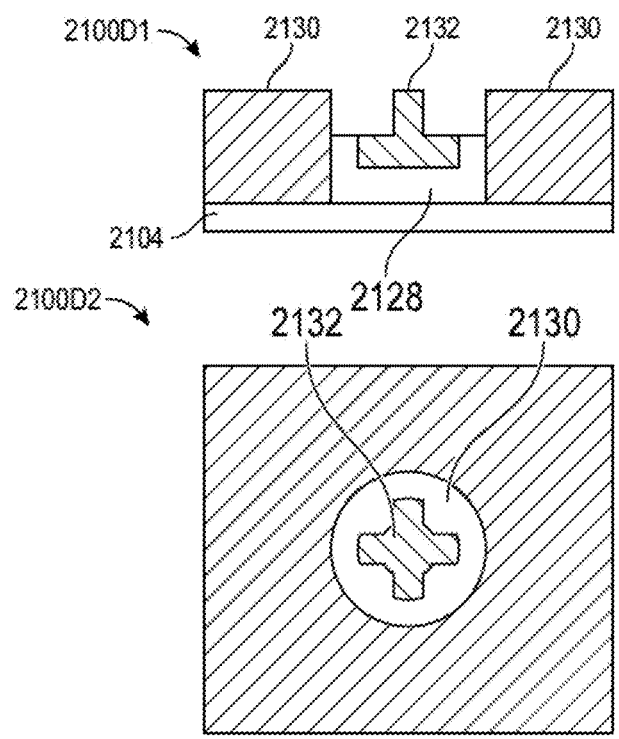

In FIG. 21D, diagrams 2100D1 and 2100D2 show additional resist 2130 being added outside of the copper cylinder structure 2128 and parallel with the substrate 2104. In addition, resist is added within the hole in the copper cylinder structure 2128, and also resist 2132 is added above the top plane of the cylinder structure 2128. The resist 2132 will form the opening 2013 in the plate 2011 of FIG. 20 that will be formed in the next action.

Figure 21E:
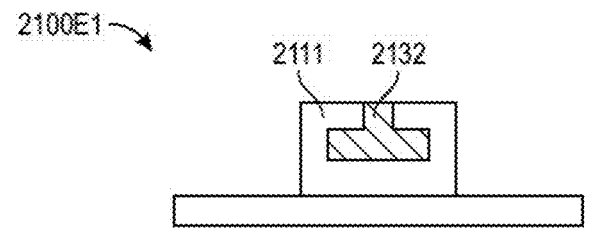
Figure 21E:
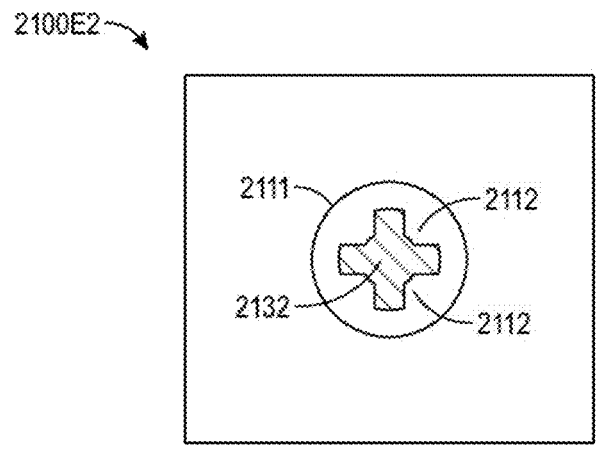

In FIG. 21E, diagrams 2100E1 and 2100E2 show the deposition of copper to create the plate top 2111, that includes the tabs 2112 that extend toward the center of the opening 2132.

Figure 21F:
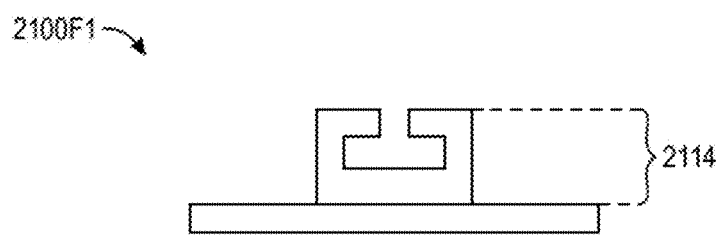
Figure 21F:
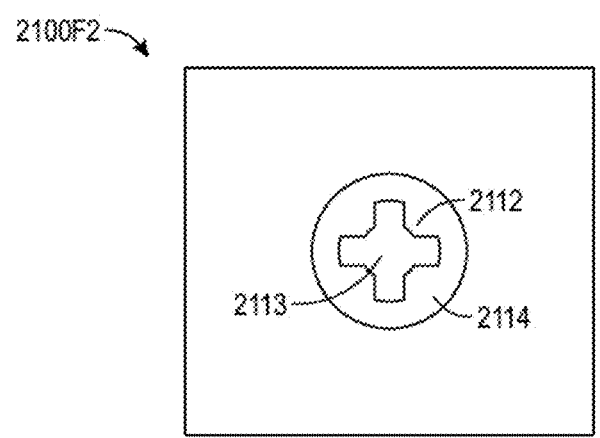

In FIG. 21F, diagrams 2100F1 and 2100F2 show the resist 2132 removed to leave the tabbed connector 2114, that includes the opening 2113 and the tabs 2112.

Figure 22:
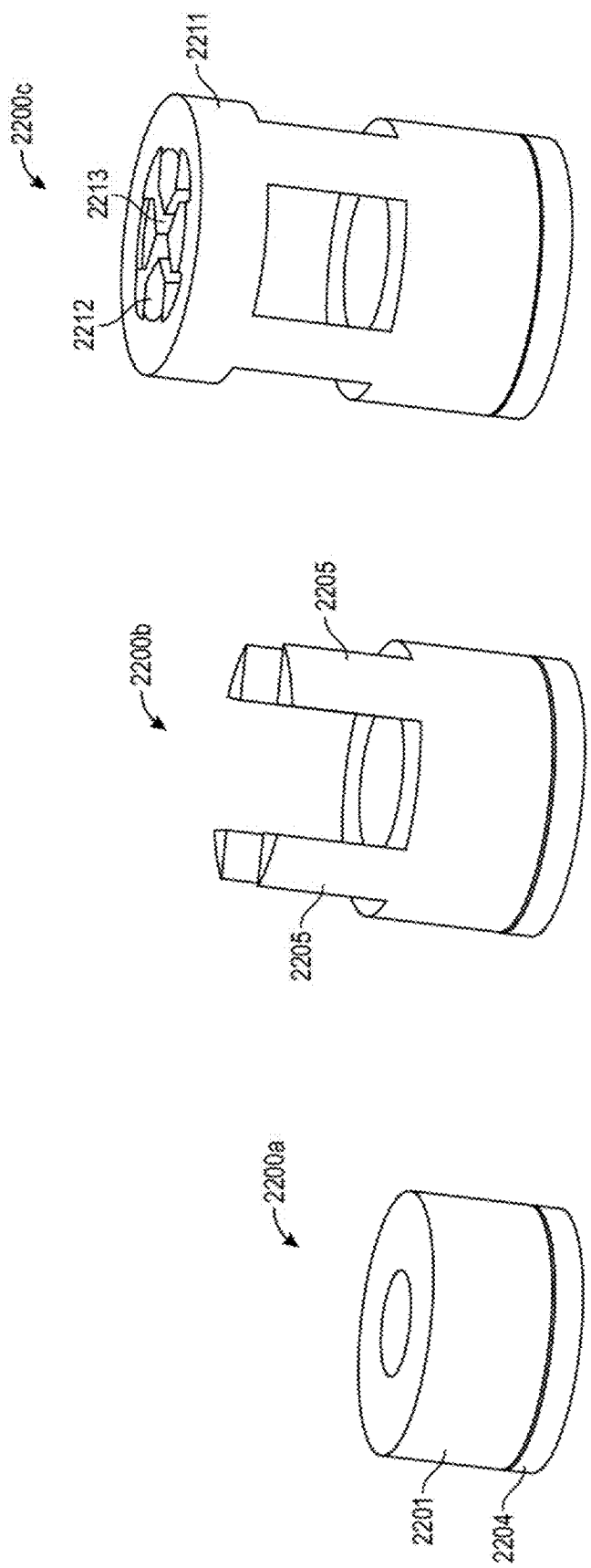
FIG. 22 illustrates perspective views of various stages of manufacture of a tabbed electrical connector, in accordance with embodiments.

FIG. 22 illustrates perspective views of various stages of manufacture of a tabbed electrical connector, in accordance with embodiments. FIG. 22 shows diagram 2200*a* that includes a portion of a substrate 2204, which may be similar to substrate 2104 of FIG. 21A, and a copper cylinder 2201 placed upon the substrate 2204. The copper cylinder 2201 may be constructed in a series of actions similar to those described with respect to FIG. 21A-21F.

Diagram 2200*b* shows pillars 2205 extending parallel to each other in parallel to the direction of the cylinder 2201.

These pillars 2205 may be constructed in a series of actions similar to those described above with respect to FIGS. 21B-21C.

Diagram 2200c shows a top plate 2211, which may be similar to top plate 2111 of FIG. 21E, that includes tabs 2212 extending within opening 2213, which may be similar to tabs 2112 extending into opening 2113 of FIG. 21F. The advantage of the structure with pillars 2205 may result in more contact compliance and travel of contacts into the tab connector 2200c to account for device warpage. In addition, there may be additional alignment advantages of these implementations as discussed further with respect to FIG. 23-24.

Figure 23:
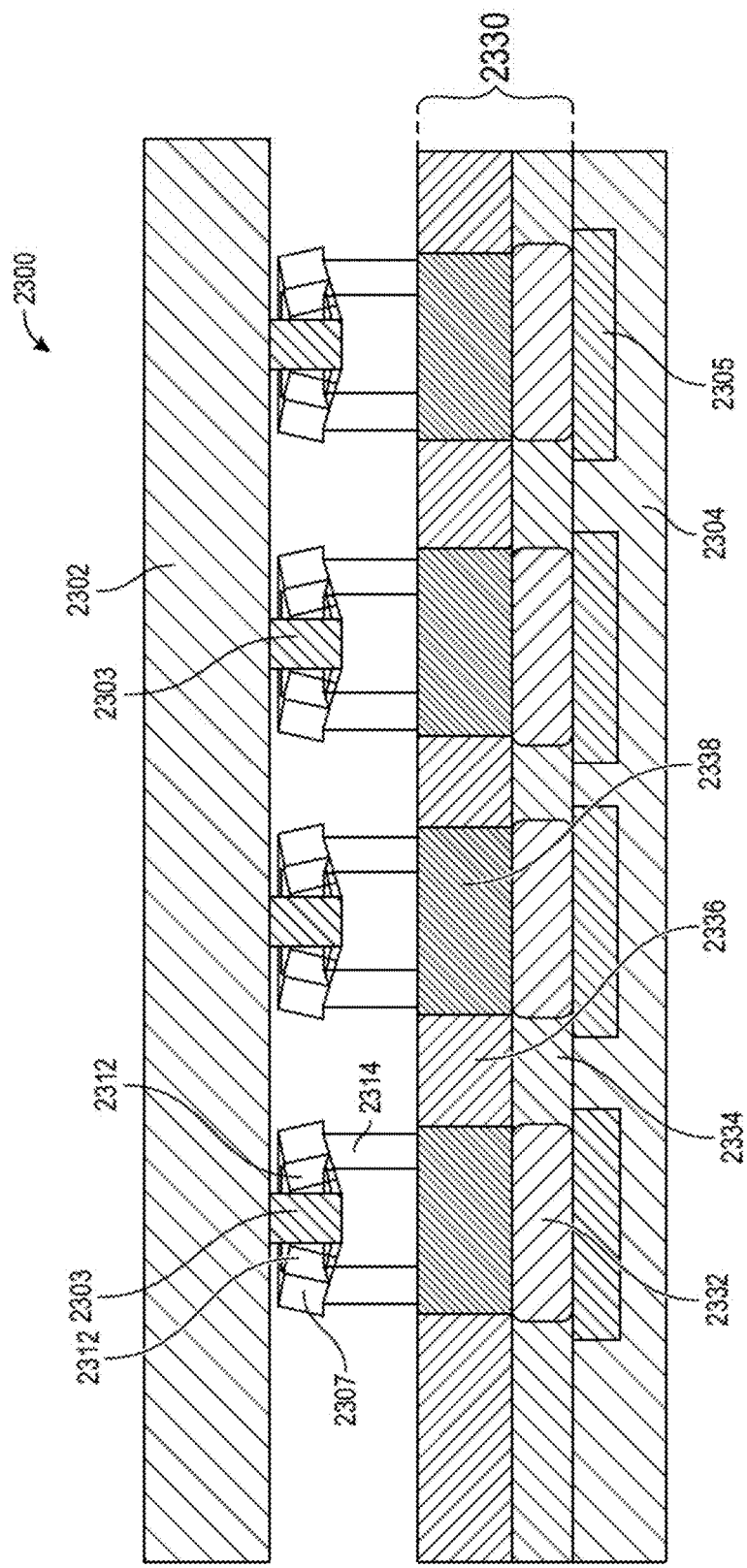
FIG. 23 illustrates a side view of a package coupled with a substrate using a tabbed electrical connector, in accordance with embodiments.

FIG. 23 illustrates a side view of a package coupled with a substrate using a tabbed electrical connector, in accordance with embodiments. Diagram 2300 shows a package 2302 with connectors 2303 to be inserted in a tab cylinder connector 2314, which may be similar, respectively, to package 2002, connectors 2003, and tab cylinder connector 2014 of FIG. 20. As shown, the tabs 2312 of the tab cylinder connector 2314 may bend in the downward fashion to accept the connector 2303, and to create a secure electrical connection as well as to physically hold the package 2302 to the substrate 2304.

In embodiments, the tab cylinder connector 2314 may be coupled with an intermediate layer 2330 that is coupled with pads 2305 within the substrate 2304. The tab cylinder connector 2314 may be coupled with a plated via 2338 within a ceramic/organic layer 2336. The plated via 2338 may be coupled with a solder attach 2332 within a capillary underfill (CUF) layer 2334.

Figure 24:
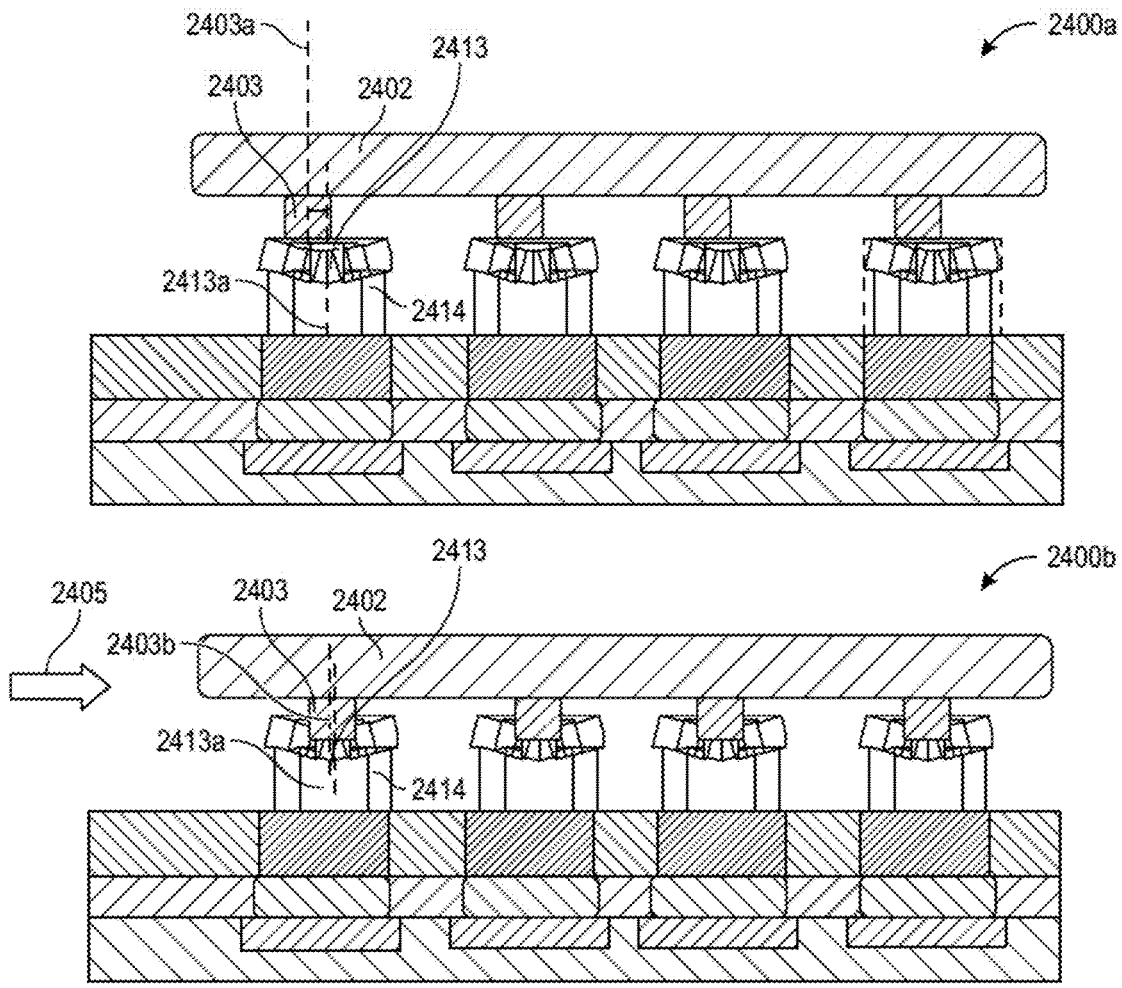
FIG. 24 illustrates a before and after side view of a package inserted into a tabbed electrical connector where the package is self-aligned by the tabbed electrical connector, in accordance with embodiments.

FIG. 24 illustrates a before and after side view of a package inserted into a tabbed electrical connector where the package is self-aligned by the tabbed electrical connector, in accordance with embodiments. Diagram 2400a shows a package 2402 with multiple connectors 2403 that are being inserted into openings 2413 of a tab cylinder connectors 2414. As shown, the centerline of the connector 2403a is offset from the centerline of the opening 2413a.

Diagram 2400b shows the package 2402 seated, where the individual connectors 2403 have shifted over in the direction 2405 to properly seat within the openings 2413, where the centerline of the connectors 2403a are in alignment, respectively, with the centerline of the openings 2413a. In embodiments, this self-centering adjustment is due to the center of the openings 2413 being in the center of the cylinders that are part of the tabbed cylindrical connectors 2414.

Figure 25:
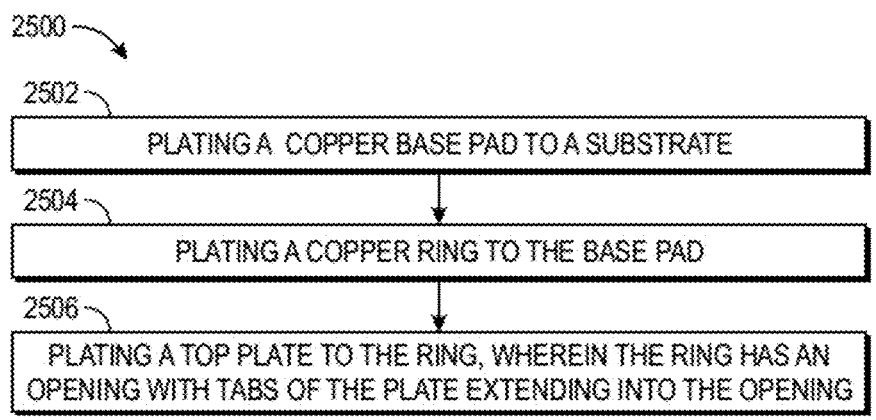
FIG. 25 illustrates an example of a process for manufacturing a tabbed electrical connector, in accordance with embodiments.

FIG. 25 illustrates an example of a process for manufacturing a tabbed electrical connector, in accordance with embodiments. Process 2500 may be implemented by one or more processes, systems, techniques, or apparatus described with respect to FIG. 20-24.

At block 2502, the process may include plating a copper base pad to a substrate. In embodiments, this process may involve a legacy plating process to produce results is shown in diagrams 2100A1 and 2100A2 of FIG. 21A.

At block 2504, the process may further include plating a copper ring to the base pad. In embodiments, this process may involve a combination of applying resist layers, plating, and subsequently removing the resist layers. This process may be similar to the process described with respect to FIGS. 21B-21C.

At block 2506, the process may further include plating a top plate to the ring, wherein the ring has an opening with tabs of the plate extending into the opening. In embodiments, this process may involve a combination of applying resist layers, plating, and subsequently removing the resist layers. This process may be similar to the process described with respect to FIGS. 21D-21F.

Figure 26:
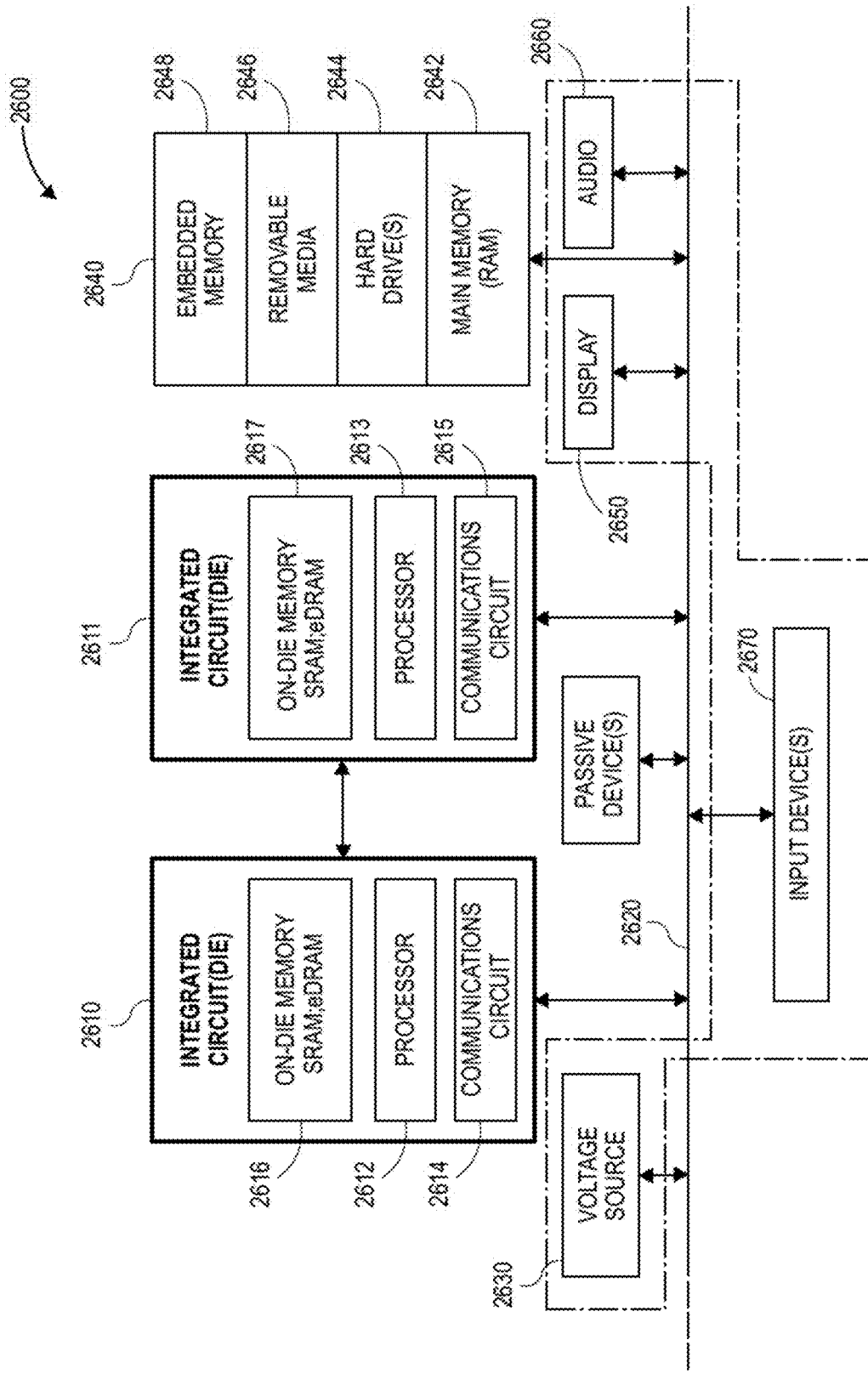
FIG. 26 schematically illustrates a computing device, in accordance with embodiments.

FIG. 26 schematically illustrates a computing device, in accordance with embodiments. The computer system 2600 (also referred to as the electronic system 2600) as depicted can embody interconnects, according to any of the several disclosed embodiments and their equivalents as set forth in this disclosure. The computer system 2600 may be a mobile device such as a netbook computer. The computer system 2600 may be a mobile device such as a wireless smart phone. The computer system 2600 may be a desktop computer. The computer system 2600 may be a hand-held reader. The computer system 2600 may be a server system. The computer system 2600 may be a supercomputer or high-performance computing system.

In an embodiment, the electronic system 2600 is a computer system that includes a system bus 2620 to electrically couple the various components of the electronic system 2600. The system bus 2620 is a single bus or any combination of busses according to various embodiments. The electronic system 2600 includes a voltage source 2630 that provides power to the integrated circuit 2610. In some embodiments, the voltage source 2630 supplies current to the integrated circuit 2610 through the system bus 2620.

The integrated circuit 2610 is electrically coupled to the system bus 2620 and includes any circuit, or combination of circuits according to an embodiment. In an embodiment, the integrated circuit 2610 includes a processor 2612 that can be of any type. As used herein, the processor 2612 may mean any type of circuit such as, but not limited to, a microprocessor, a microcontroller, a graphics processor, a digital signal processor, or another processor. In an embodiment, the processor 2612 includes, or is coupled with, interconnects, as disclosed herein. In an embodiment, SRAM embodiments are found in memory caches of the processor. Other types of circuits that can be included in the integrated circuit 2610 are a custom circuit or an application-specific integrated circuit (ASIC), such as a communications circuit 2614 for use in wireless devices such as cellular telephones, smart phones, pagers, portable computers, two-way radios, and similar electronic systems, or a communications circuit for servers. In an embodiment, the integrated circuit 2610 includes on-die memory 2616 such as static random-access memory (SRAM). In an embodiment, the integrated circuit 2610 includes embedded on-die memory 2616 such as embedded dynamic random-access memory (eDRAM).

In an embodiment, the integrated circuit 2610 is complemented with a subsequent integrated circuit 2611. Useful embodiments include a dual processor 2613 and a dual communications circuit 2615 and dual on-die memory 2617 such as SRAM. In an embodiment, the dual integrated circuit 2610 includes embedded on-die memory 2617 such as eDRAM.

In an embodiment, the electronic system 2600 also includes an external memory 2640 that in turn may include one or more memory elements suitable to the particular application, such as a main memory 2642 in the form of RAM, one or more hard drives 2644, and/or one or more drives that handle removable media 2646, such as diskettes, compact disks (CDs), digital variable disks (DVDs), flash memory drives, and other removable media known in the art. The external memory 2640 may also be embedded memory 2648 such as the first die in a die stack, according to an embodiment.

In an embodiment, the electronic system 2600 also includes a display device 2650, an audio output 2660. In an embodiment, the electronic system 2600 includes an input device such as a controller 2670 that may be a keyboard, mouse, trackball, game controller, microphone, voice-recognition device, or any other input device that inputs information into the electronic system 2600. In an embodiment, an input device 2670 is a camera. In an embodiment, an input device 2670 is a digital sound recorder. In an embodiment, an input device 2670 is a camera and a digital sound recorder.

As shown herein, the integrated circuit 2610 can be implemented in a number of different embodiments, including a package substrate having interconnects, according to any of the several disclosed embodiments and their equivalents, an electronic system, a computer system, one or more methods of fabricating an integrated circuit, and one or more methods of fabricating an electronic assembly that includes a package substrate having interconnects, according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed package substrates having interconnects embodiments and their equivalents. A foundation substrate may be included, as represented by the dashed line of FIG. 26. Passive devices may also be included, as is also depicted in FIG. 26.

EXAMPLES

The following paragraphs describe examples of various embodiments.

Example 1 is an apparatus comprising: an electrically conductive layer that has a first side and a second side opposite the first side; a first insulator layer coupled with the first side of the conductive layer; a second insulator layer coupled with the second side of the conductive layer; wherein a region of the conductive layer includes an opening of a portion of the first insulator layer and an opening of a portion of the second insulator layer that are adjacent to the region; and wherein an electrical connector of a first device is to be electrically coupled to a portion of the region of the conductive layer on the first side of the electrically conductive layer, and an electrical connector of a second device is to be electrically coupled to a portion of the region of the conductive layer on the second side of the electrically conductive layer.

Example 2 may include the apparatus of example 1, wherein the region of the conductive layer is electrically isolated from another region of the conductive layer.

Example 3 may include the apparatus of example 2, wherein the region of the conductive layer is surrounded by an electrically insulated area.

Example 4 may include the apparatus of example 3, wherein the electrically insulated area includes air or a dielectric.

Example 5 may include the apparatus of example 2, wherein the region of the conductive layer further includes a first subregion and a second subregion; wherein the first subregion is bent out of a plane of the conductive layer and toward a plane of the first insulating layer; wherein the second subregion is bent out of the plane of the conductive layer and toward a plane of the second insulating layer; and wherein the first subregion is to electrically couple with the electrical connector of the first device and the second subregion is to electrically couple with the electrical connector of the second device to electrically couple the electrical connector of the first device with the electrical connector of the second device.

Example 6 may include the apparatus of example 5, wherein the first subregion and the second subregion are to apply a mechanical force, respectively, against the electrical connector of the first device and the electrical connector of the second device.

Example 7 may include the apparatus of any one of examples 5-6, wherein the first device is a device under test, and the second device is a test pad.

Example 8 may include the apparatus of any one of examples 1-7, wherein the region of the conductive layer includes a second region of the conductive layer; wherein the opening of a portion of the first insulator layer is a first opening of the portion of the first insulator layer and further including a second opening of a portion of the first insulator layer; wherein the opening of a portion of the second insulator layer is a first opening of the second insulator layer and further including a second opening of a portion of the second insulator layer; and wherein the second opening of the first insulating layer and the second opening of the second insulating layer are adjacent, respectively, to the second region of the conductive layer.

Example 9 may include the apparatus of example 8, wherein the second region of the conductive layer are electrically connected with the other regions of the conductive layer.

Example 10 may be a method, comprising: creating a pattern of a region in a conductive layer that has a first side and a second side opposite the first side, wherein the region corresponds to a location of an electrical connector of a device to be electrically coupled with the conductive layer; coupling a first insulating layer to the first side of the conductive layer, the first insulating layer with an opening adjacent to a portion of the region of the conductive layer; and coupling a second insulating layer to the second side of the conductive layer, the second insulating layer with an opening adjacent to a portion of the region of the conductive layer.

Example 11 may include the method of example 10, wherein creating the pattern of the region in the conductive layer further includes: identifying an area of the conductive layer that surrounds the region, the area having a first portion and a second portion; removing the first portion of the identified area; and wherein the second portion is to physically and electrically couple the region with the conductive layer.

Example 12 may include the method of example 11, further comprising, after coupling the first insulating layer and coupling the second insulating layer, removing the second portion of the identified area to electrically isolate the region from a non-region part of the conductive layer.

Example 13 may include the method of example 12, further comprising: separating a portion of the region in the conductive layer into a first subregion and a second subregion.

Example 14 may include the method of example 13, further comprising: bending the first subregion in a direction toward the first insulating layer; and bending the second subregion in a direction toward the second insulating layer.

Example 15 may include the method of example 14, further comprising: wherein the device is a first device; electrically coupling the first subregion to the electrical connector of the first device; and electrically coupling the second subregion to an electrical connector of a second device.

Example 16 may be an apparatus comprising: a substrate with a first side and a second side opposite the first side; a cylinder extending from the first side of the substrate perpendicular to a plane of the substrate; a plate coupled at an end of the cylinder opposite a base end of the cylinder proximate to the substrate; an opening in the plate proximate to a centerline of the cylinder, with two or more tabs of the plate extending into the opening of the plate; wherein the cylinder and the plate are electrically conductive; and wherein the opening in the plate is to receive a connector of a device.

Example 17 may include the apparatus of example 16, wherein one of the two or more tabs are bent into the cylinder in a direction toward the substrate.

Example 18 may include the apparatus of example 17, wherein edges, respectively, of the two or more bent tabs are to electrically couple with the connector of the device and to physically hold at least a portion of the connector of the device within the cylinder.

Example 19 may include the apparatus of example 17, wherein the cylinder and the plate are a first cylinder and a first plate; and wherein the apparatus further comprises a second cylinder extending from the first side of the substrate perpendicular to the plane of the substrate; a second plate coupled, respectively, at an end of the second cylinder opposite a base end of the second cylinder proximate to the substrate; an opening in the second plate proximate to a centerline of the second cylinder, with two or more tabs of the second plate extending into the opening of the second plate; and wherein the second cylinder and the second plate are electrically conductive.

Example 20 may include the apparatus of example 19, wherein the connector is a first connector of the device; and further including: a second connector of the device; and wherein edges respectively of the two or more bent tabs of the second cylinder are to physically hold at least a portion of the second connector of the device within a cylinder.

Example 21 may include the apparatus of example 20, wherein the opening of the first plate and the opening of the second plate are positioned to facilitate centering of the device in a location on a substrate when the first connector is inserted into the first opening and the second connector is inserted into the second opening.

Example 22 may be a system, comprising: a substrate with a first side and a second side opposite the first side; a first cylinder coupled with and extending from the first side of the substrate in a first location perpendicular to a plane of the substrate; a second cylinder coupled with and extending from the first side of the substrate in a second location perpendicular to a plane of the substrate and on the same side of the substrate as the first cylinder; a first plate and a second plate coupled, respectively, at an end of the first cylinder and at an end of the second cylinder opposite a base end proximate to the substrate; an opening in the first plate and the second plate proximate to a centerline of the cylinder, with two or more tabs of the plate extending into the opening of the plate; and a chip coupled with the substrate, with a first connector and a second connector inserted, respectively, into the first cylinder and second cylinder.

Example 23 may include the system of example 22, wherein one of the two or more tabs of the first cylinder and the second cylinder are bent, respectively, into a middle of the first and a middle of the second cylinder and in a direction toward the substrate.

Example 24 may include the system of example 23, wherein edges, respectively, of the two or more bent tabs of the first and the second cylinder are to electrically couple with the connector of the device, and to physically hold at least a portion of the connector of the device within the cylinder.

Example 25 may include the system of anyone of examples 22-24, wherein the opening of the first plate and the opening of the second plate are positioned to facilitate centering of the chip in a location on the substrate when the first connector is inserted into the first opening and the second connector is inserted into the second opening.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated embodiments, including what is described in the Abstract, is not intended to be exhaustive or to limit embodiments to the precise forms disclosed. While specific embodiments are described herein for illustrative purposes, various equivalent modifications are possible within the scope of the embodiments, as those skilled in the relevant art will recognize.

These modifications may be made to the embodiments in light of the above detailed description. The terms used in the following claims should not be construed to limit the embodiments to the specific implementations disclosed in the specification and the claims. Rather, the scope of the invention is to be determined entirely by the following claims, which are to be construed in accordance with established doctrines of claim interpretation.

What is claimed is:

1. An apparatus comprising:
   an electrically conductive layer that has a first side and a second side opposite the first side;
   a first insulator layer coupled with the first side of the conductive layer;
   a second insulator layer coupled with the second side of the conductive layer;
   wherein a region of the conductive layer includes an opening of a portion of the first insulator layer and an opening of a portion of the second insulator layer that are adjacent to the region, wherein the region comprises a plurality of discrete subregions that form an X-pattern, and wherein each one of the plurality of discrete subregions has a curved edge; and
   wherein an electrical connector of a first device is to be electrically coupled to a portion of the region of the conductive layer on the first side of the electrically conductive layer, and an electrical connector of a second device is to be electrically coupled to a portion of the region of the conductive layer on the second side of the electrically conductive layer.

2. The apparatus of claim 1, wherein the region of the conductive layer is electrically isolated from another region of the conductive layer.

3. The apparatus of claim 2, wherein the region of the conductive layer is surrounded by an electrically insulated area.

4. The apparatus of claim 3, wherein the electrically insulated area includes air or a dielectric.

5. The apparatus of claim 2, wherein a first one of the subregions is bent out of a plane of the conductive layer and toward a plane of the first insulating layer;
   wherein a second one of the subregions is bent out of the plane of the conductive layer and toward a plane of the second insulating layer; and
   wherein the first subregion is to electrically couple with the electrical connector of the first device and the second subregion is to electrically couple with the electrical connector of the second device to electrically couple the electrical connector of the first device with the electrical connector of the second device.

6. The apparatus of claim 5, wherein the first subregion and the second subregion are to apply a mechanical force, respectively, against the electrical connector of the first device and the electrical connector of the second device.

7. The apparatus of claim 6, wherein the first device is a device under test, and the second device is a test pad.

8. The apparatus of claim 1, wherein the region of the conductive layer includes a second region of the conductive layer;
   wherein the opening of a portion of the first insulator layer is a first opening of the portion of the first insulator layer and further including a second opening of a portion of the first insulator layer;
   wherein the opening of a portion of the second insulator layer is a first opening of the second insulator layer and further including a second opening of a portion of the second insulator layer;
   wherein the second opening of the first insulating layer and the second opening of the second insulating layer are adjacent, respectively, to the second region of the conductive layer.

9. The apparatus of claim 8, wherein the second region of the conductive layer is electrically connected with other regions of the conductive layer.

* * * * *